United States Patent
Terada

(10) Patent No.: US 12,526,970 B2
(45) Date of Patent: Jan. 13, 2026

(54) SHAFT DRIVE DEVICE AND COMPONENT MOUNTING DEVICE

(71) Applicant: YAMAHA HATSUDOKI KABUSHIKI KAISHA, Iwata (JP)

(72) Inventor: Kazuhiro Terada, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 658 days.

(21) Appl. No.: 17/904,775

(22) PCT Filed: Feb. 26, 2020

(86) PCT No.: PCT/JP2020/007873
§ 371 (c)(1),
(2) Date: Aug. 22, 2022

(87) PCT Pub. No.: WO2021/171445
PCT Pub. Date: Sep. 2, 2021

(65) Prior Publication Data
US 2022/0418175 A1    Dec. 29, 2022

(51) Int. Cl.
*B23P 19/00* (2006.01)
*H05K 13/04* (2006.01)

(52) U.S. Cl.
CPC ..... *H05K 13/0406* (2018.08); *H05K 13/0409* (2018.08); *H05K 13/0411* (2018.08)

(58) Field of Classification Search
CPC ........... H05K 13/0406; H05K 13/0409; H05K 13/041; H05K 13/411
See application file for complete search history.

(56) References Cited

U.S. PATENT DOCUMENTS

| | | | |
|---|---|---|---|
| 10,834,859 B2* | 11/2020 | Ito | H05K 13/0406 |
| 10,919,711 B2* | 2/2021 | Hara | H05K 13/0409 |
| 11,067,190 B2* | 7/2021 | Davis | F16K 31/086 |
| 2005/0019146 A1 | 1/2005 | Burger et al. | |
| 2009/0183361 A1 | 7/2009 | Takahira et al. | |

(Continued)

FOREIGN PATENT DOCUMENTS

| | | |
|---|---|---|
| CN | 102387698 A | 3/2012 |
| JP | H11-4100 A | 1/1999 |

(Continued)

OTHER PUBLICATIONS

International Search Report issued in PCT/JP2020/007873; mailed May 19, 2020.

*Primary Examiner* — Paul D Kim
(74) *Attorney, Agent, or Firm* — Studebaker Brackett PLLC

(57) ABSTRACT

A shaft drive device includes a plurality of shafts each retained in a raisable and lowerable manner; a return spring for urging each of the shafts upward; an actuating member contactable with a pressed part of any one of the shafts for raising and lowering a selected shaft; and a raising and lowering mechanism which changes a posture of the actuating member between a first posture of coming into contact with the pressed part of the shaft and pressing the pressed part to lower the shaft against an urging force of the return spring and a second posture of releasing the pressing. The pressed part of the shaft is made of ferromagnet, and the actuating member is given a magnetic force.

20 Claims, 14 Drawing Sheets

(56) References Cited

U.S. PATENT DOCUMENTS

2018/0263149 A1  9/2018 Tsuri
2018/0288911 A1  10/2018 Tsuri et al.

FOREIGN PATENT DOCUMENTS

| | | |
|---|---|---|
| JP | 2005-536069 A | 11/2005 |
| JP | 2009-170525 A | 7/2009 |
| JP | 2009-170830 A | 7/2009 |
| JP | 2009-212004 A | 9/2009 |
| JP | 2011-103313 A | 5/2011 |
| WO | 2017/056293 A1 | 4/2017 |
| WO | 2017/056295 A1 | 4/2017 |

* cited by examiner

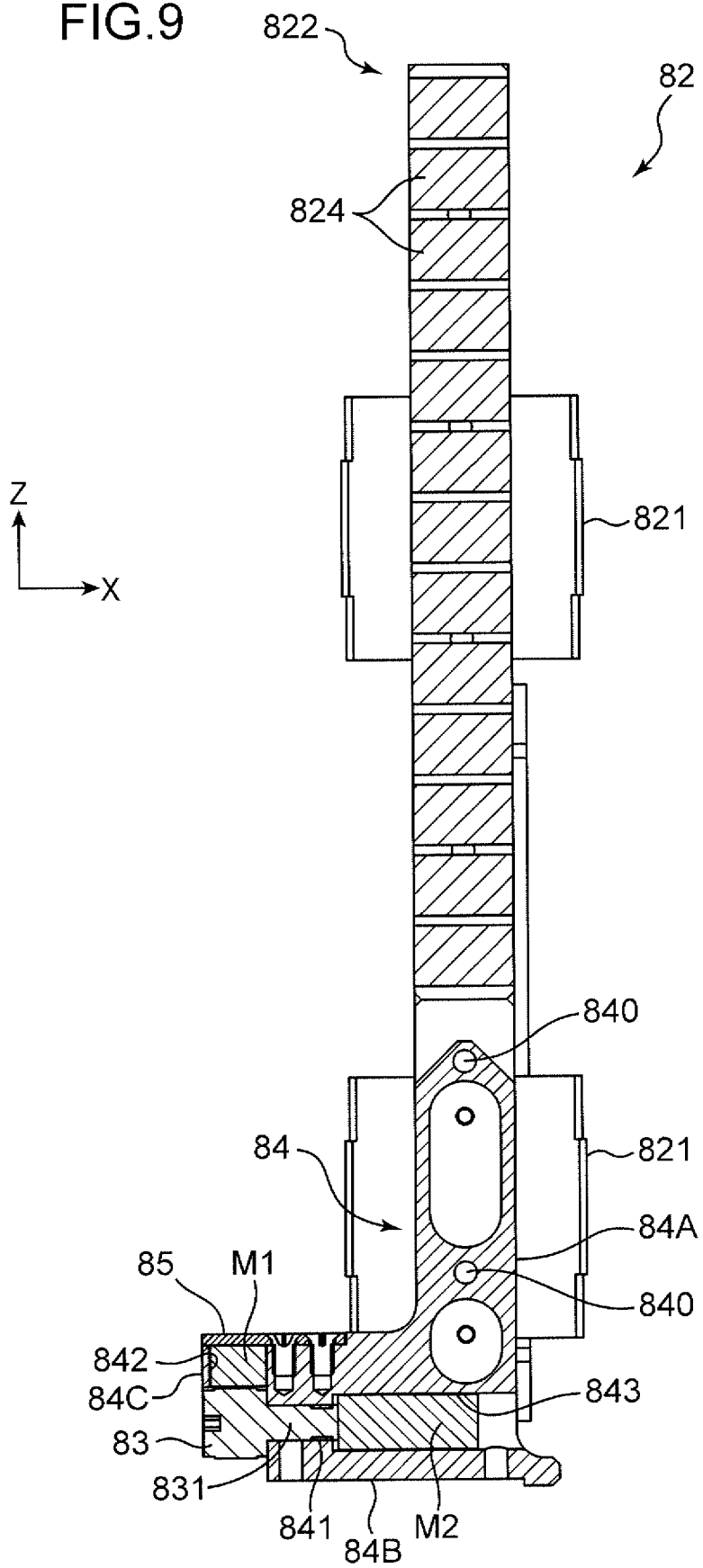

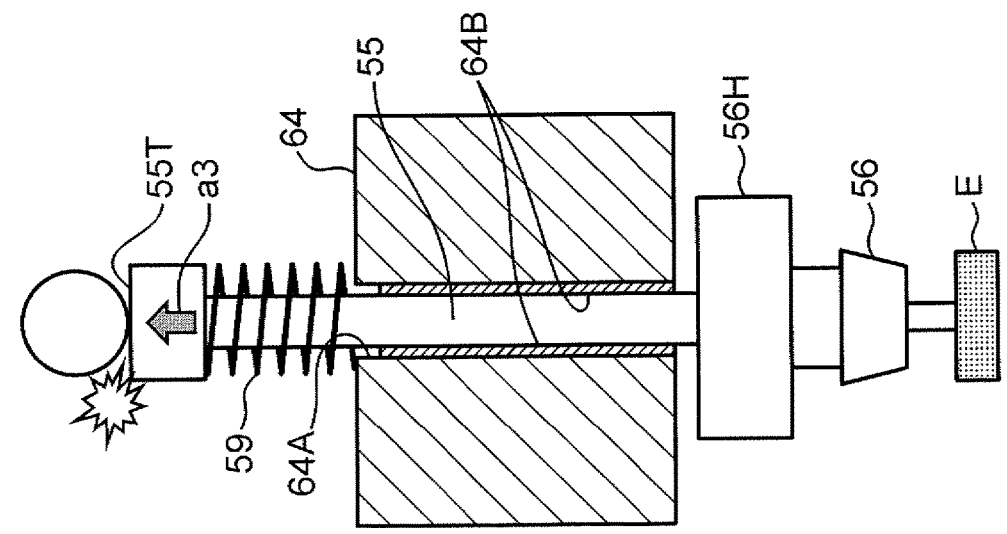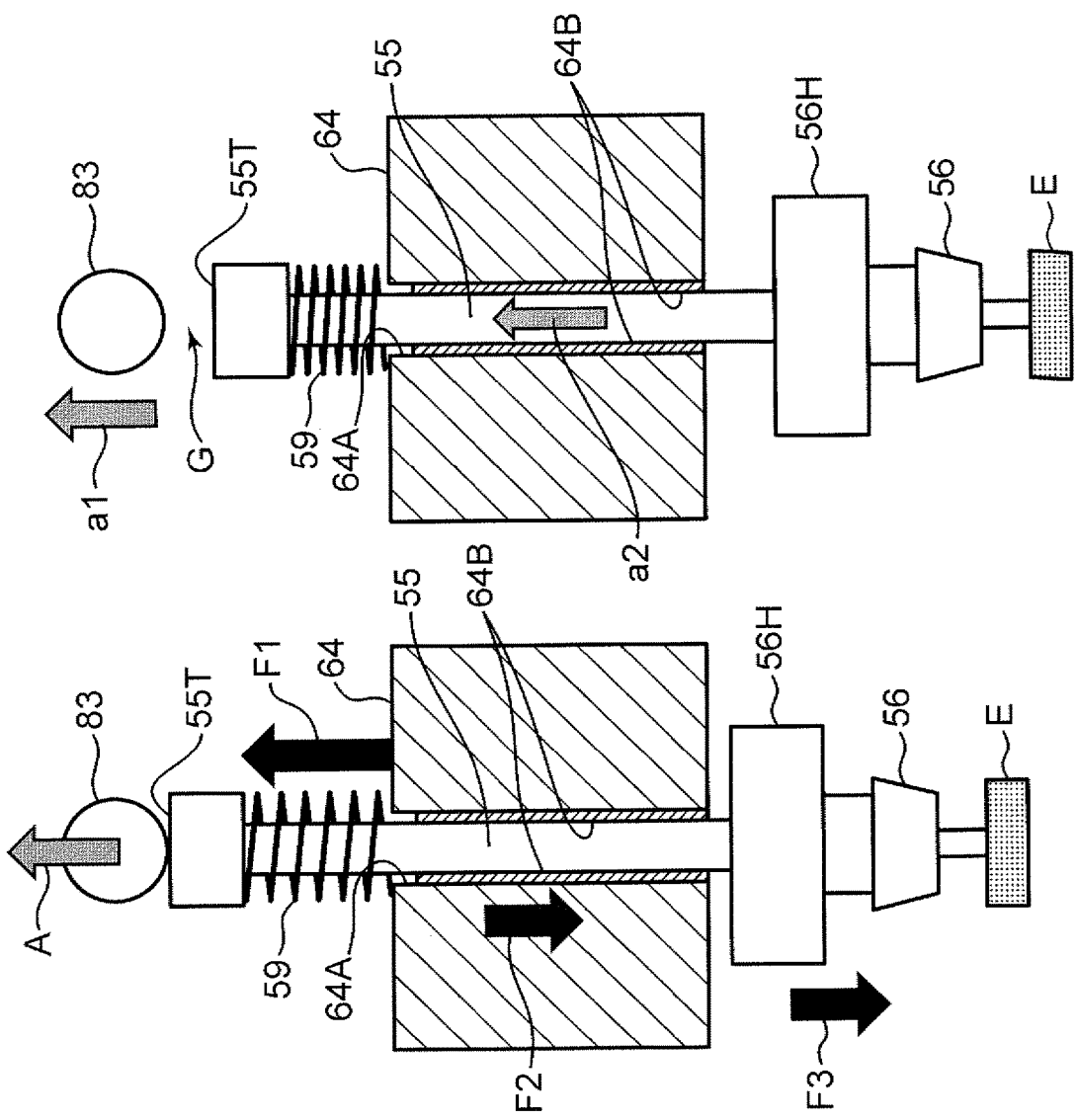

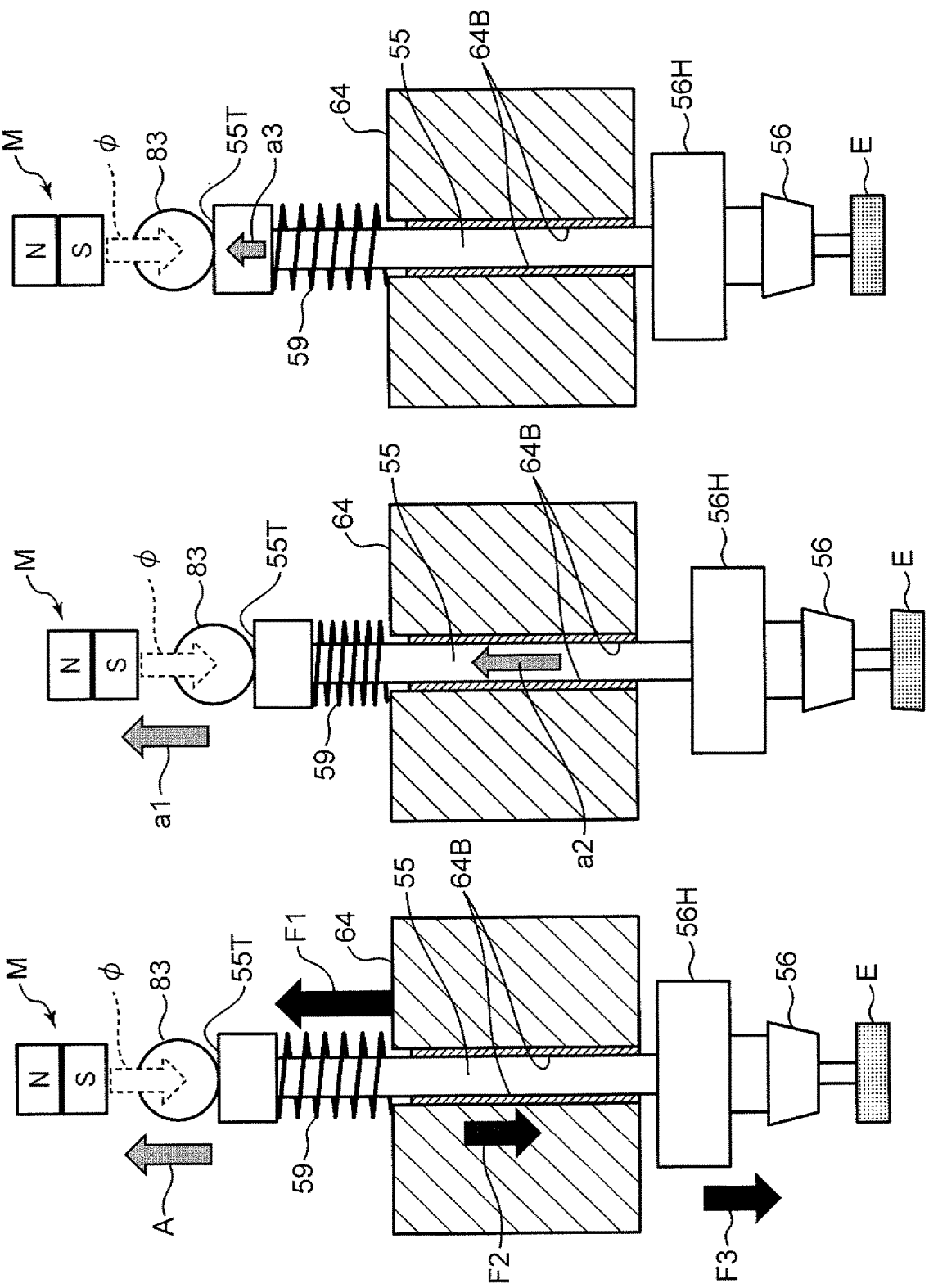

FIG.12A
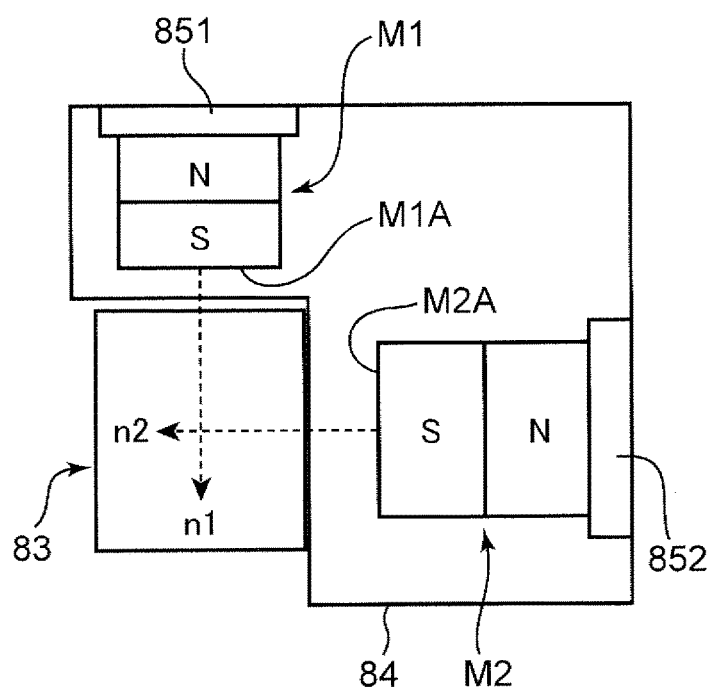
FIG.12B
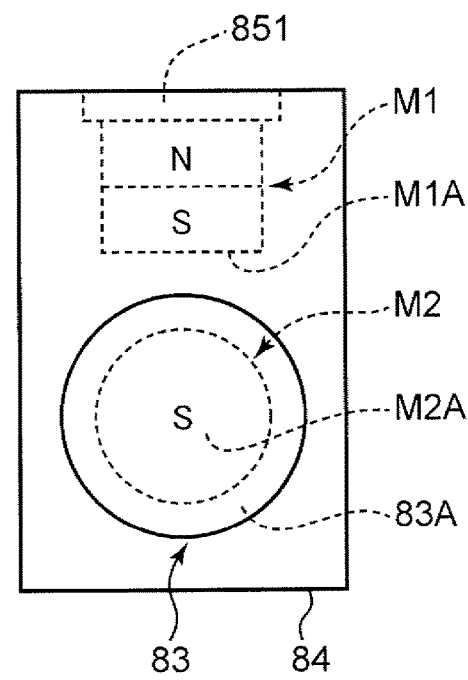
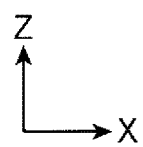
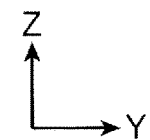

SHAFT DRIVE DEVICE AND COMPONENT MOUNTING DEVICE

CROSS-REFERENCE TO RELATED APPLICATION

This application is a National Stage of International Patent Application No. PCT/JP2020/007873, filed Feb. 26, 2020, the entire content of which is incorporated herein by reference.

BACKGROUND

Technical Field

The present disclosure relates to a shaft drive device which raises and lowers a shaft, and to a component mounting device including a rotary head adopting the shaft drive device.

Background Art

There have been shaft drive devices each including a plurality of shafts to be raised and lowered; and a raising and lowering mechanism provided for the shafts but not allotted thereto one to one. For instance, International Unexamined Patent Publication No. 2017/056295 discloses, as an example of the shaft drive device, a rotary head for a component mounting device. The rotary head includes a rotating body which retains a plurality of shafts in an annual form in a raisable and lowerable manner, each of the shafts being provided with a component suction nozzle attached thereto; an actuating member like a cam follower for pressing the shaft downward; and a raising and lowering mechanism which raises and lowers the actuating member. The actuating member comes into contact with a pressed part of a selected shaft based on a rotation phase of the rotating body and presses the shaft downward. A return spring is provided for each of the shafts to urge the shaft upward.

In the rotary head, a sum of an inertial force and a frictional force between the rotating body and the shaft is occasionally greater than an urging force of the return spring in the raising of the shaft after the component suction nozzle retains a component. In this occasion, the shaft fails to follow the raising of the actuating member, and the actuating member and the pressed part are temporarily separated from each other. When the pressed part comes into re-contact with the actuating member after the separation, the shaft receives an impact. This would cause defects of falling-off of the component being retained, deviation of the sucked posture of the component, or other defects.

One way of suppressing the separation is to increase a return force of the shaft by increasing the urging force of the return spring. However, a design change accompanied by an increase in the dimension, e.g., an increase in the wire diameter of the spring, an increase in the set length of the spring, and the like, or other change is required to increase the return force. In this respect, a device belonging to a field demanding a size reduction faces a limit to an increase in the return force.

Moreover, failure in increasing the return force may cause various defects. The inertial force acting on the shaft is proportional to a total weight of the weight of the shaft, the weight of the component suction nozzle, and the weight of the sucked component. An attempt to mount a larger component that requires a large and heavy shaft and a corresponding component suction nozzle may fail under a restriction on the return force. Furthermore, the inertial force acting on the shaft is proportional to a driving acceleration rate of the shaft as well. Hence, a smaller return force renders only a slower driving acceleration rate, resulting in impeding acceleration of the device. Moreover, there is a limit to reduction of the frictional force between the rotating body and the shaft within a realistic cost range.

SUMMARY

Accordingly, the present disclosure provides a shaft drive device which can suppress separation of a pressed part of a shaft and an actuating member from each other without increasing an urging force of a return spring, and a component mounting device including a rotary head adopting the shaft drive device.

A shaft drive device according to an aspect of the present disclosure includes a plurality of shafts each having a pressed part and retained in a raisable and lowerable manner; a return spring provided for each of the shafts to urge the shaft upward; an actuating member contactable with the pressed part of any one of the shafts for raising and lowering a selected shaft; and a raising and lowering mechanism which changes a posture of the actuating member between a first posture of coming into contact with the pressed part of the shaft and pressing the pressed part to lower the shaft against an urging force of the return spring and a second posture of releasing the pressing. The pressed part of the shaft is made of ferromagnet, and the actuating member is given a magnetic force.

A component mounting device according to another aspect of the present disclosure includes a rotary head for mounting a component onto a board. The rotary head includes a plurality of shafts each having a pressed part at an upper end thereof, and a component suction nozzle at a lower end thereof; a rotating body which retains the shafts in an annual form around a central axis in a raisable and lowerable manner, and rotates about the central axis; a return spring provided for each of the shafts to urge the shaft upward; an actuating member contactable with the pressed part of any one of the shafts for raising and lowering a selected shaft; a raising and lowering mechanism which changes a posture of the actuating member between a first posture of coming into contact with the pressed part of the shaft and pressing the pressed part to lower the shaft against an urging force of the return spring and a second posture of releasing the pressing; and a rotation driving mechanism which drives a rotation of the rotating body so that the pressed part of the selected shaft comes under the arranged position of the actuating member. The pressed part of the shaft is made of ferromagnet, and the actuating member is given a magnetic force.

BRIEF DESCRIPTION OF THE DRAWINGS

FIG. 9 is a cross-sectional view taken along the line IX-IX in FIG. 8;

FIG. 10A to FIG. 10C are schematic views each explaining a raising and lowering operation of a shaft in a comparative example;

FIG. 11A to FIG. 11C are schematic views each explaining a raising and lowering operation of a shaft in a present embodiment;

FIG. 12A is a cross-sectional side view of a holder holding magnets and a cam follower, and FIG. 12B is a front view of the holder;

DETAILED DESCRIPTION

Hereinafter, an embodiment of the present disclosure will be described with reference to the accompanying drawings. The embodiment represents an example where a shaft drive device according to the present disclosure is applied to a surface mounter which includes a component mounting device including a rotary head for mounting an electronic component onto a printed circuit board. Needless to say, the present disclosure is applicable to a wide variety of shaft drive devices, in addition to the component mounting device, each including a plurality of raisable and lowerable shafts and a raising and lowering mechanism provided for the shafts but not allotted thereto one to one, and each configured to raise and lower a selected shaft.

[Overall Configuration of a Surface Mounter]

Figure 1:
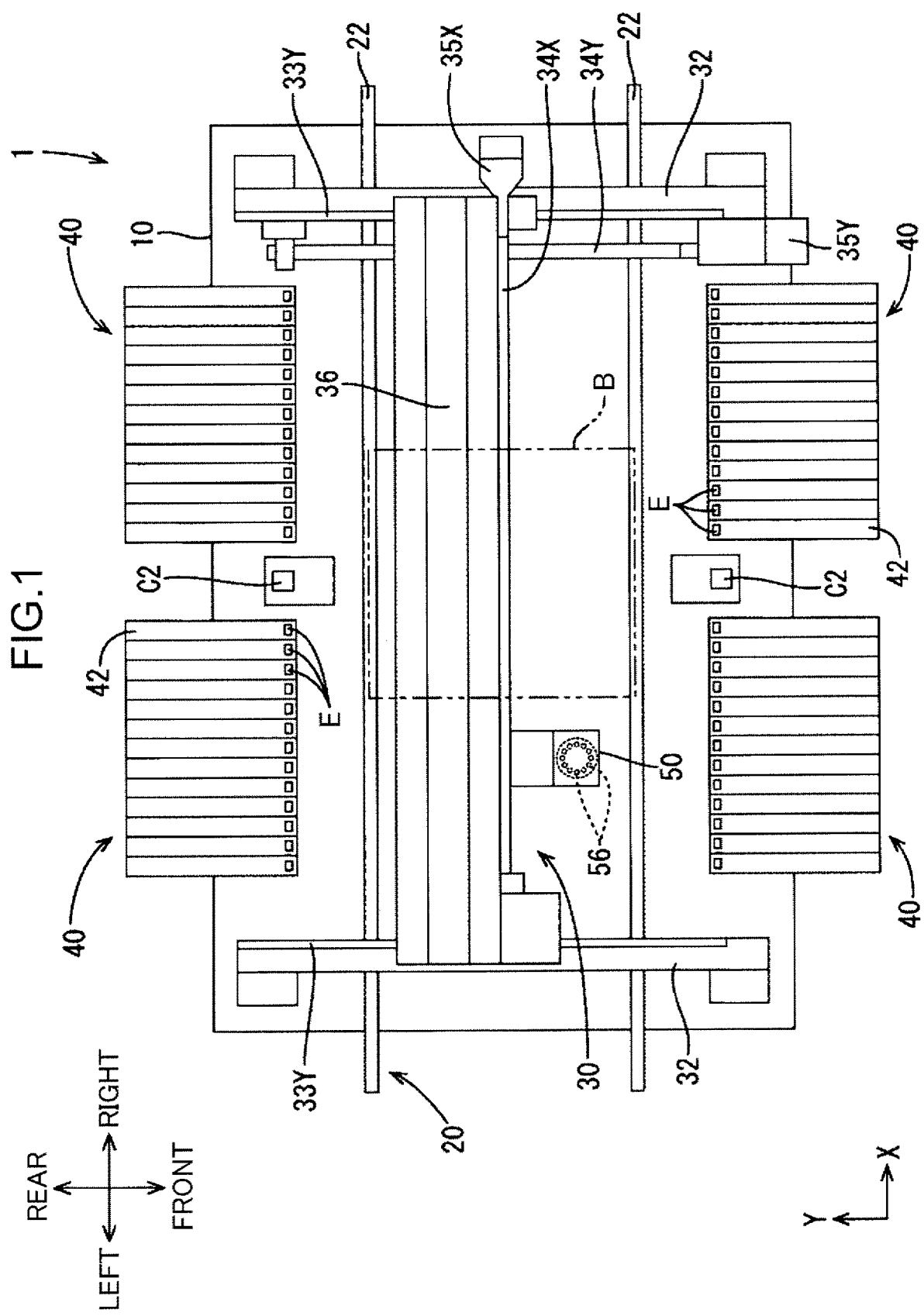
FIG. 1 is a top view of a surface mounter adopting a shaft drive device and a component mounting device according to the present disclosure.

FIG. 1 is a top view of a surface mounter 1 according to the embodiment. The surface mounter 1 includes a base 10; a conveyer 20 for conveying a printed circuit board B (board); a component mounting device 30 for mounting an electronic component E (component) onto the printed circuit board B; and a component supply device 40 for supplying the electronic component E to the component mounting device 30.

The base 10 has a rectangular shape in a plan view and a flat top surface. A backup plate (not shown) is provided below the conveyer 20 at the base 10 to back up the printed circuit board B in mounting of the electronic component E onto the printed circuit board B. In the following description, a longitudinal direction (left-right direction in FIG. 1) of the base 10 is defined as an X-axis direction, a short direction (front-rear direction in FIG. 1) of the base 10 is defined as a Y-axis direction, and a vertical direction (up-down direction in FIG. 2) of the base 10 is defined as a Z-axis direction.

The conveyer 20 is located at substantially the center of the base 10 in the Y-axis direction for conveying the printed circuit board B in a predetermined conveyance direction (e.g., from the right to the left) along the X-axis direction. The conveyer 20 includes a pair of conveyer belts 22 to circularly drive in a conveyance direction. The printed circuit board B is conveyed in a state of bridging the conveyer belts 22 thereover. The printed circuit board B enters the surface mounter 1 from the right of the base 10 along the conveyer belt 22, and is conveyed to reach a work position on the base 10 denoted by an enclosure of a long dashed double-short dashed line in FIG. 1. The printed circuit board B is then stopped at the work position and subjected to a work of mounting the electronic component E thereonto, and thereafter, is conveyed to the outside of the surface mounter 1 from the left thereof along the conveyer belt 22.

Here, two component supply devices 40 stand side by side in the X-axis direction at the opposite corresponding two positions (front and rear positions in FIG. 1) across the conveyer 20, that is, four component supply devices are arranged in total. Each of the component supply devices 40 includes a plurality of tape feeders 42 arrayed in the X-axis direction. Each of the tape feeders 42 includes a reel (not shown) on which component supply tape (not shown) containing a plurality of electronic components E is wound, and an electric sender (not shown) for drawing the component supply tape out of the reel. The tape feeder 42 intermittently draws the component supply tape out of the reel, and supplies each electronic component E at a predetermined component supply position.

The component mounting device 30 includes a pair of support frames 32 located above the base 10; a rotary head 50; and a rotary head movement mechanism to move the rotary head 50 to a certain position in each of the X-axis direction and the Y-axis direction. The support frames 32 extend in the Y-axis direction at the opposite positions of the base 10 in the X-axis direction. The support frames 32 are provided with an X-axis servo mechanism and a Y-axis servo mechanism configuring the rotary head movement mechanism. The rotary head 50 is movable by the X-axis servo mechanism in the X-axis direction and by the Y-axis servo mechanism in the Y-axis direction within a given movable area.

Here, a pair of left and right Y-axis servo mechanisms is provided, each of the mechanisms having a Y-axis guide rail 33Y, a Y-axis ball screw 34Y engaged with an unillustrated ball nut, and a Y-axis servo motor 35Y. A head supporting body 36 fixed to the ball nut is attached to the Y-axis guide rail 33Y. Under an electricity application control of the Y-axis servo motor 35Y, the ball nut advances and retreats along the Y-axis ball screw 34Y. As a result, the head supporting body 36 fixed to the ball nut and the rotary head 50 move in the Y-axis direction along the Y-axis guide rail 33Y.

The X-axis servo mechanism has an X-axis guide rail (not shown), an X-axis ball screw 34X engaged with an unillustrated ball nut, and an X-axis servo motor 35X. The rotary head 50 is attached to the X-axis guide rail movably in an axial direction thereof. Under an electricity application control of the X-axis servo motor 35X, the ball nut advances and retreats along the X-axis ball screw 34X. As a result, the rotary head 50 fixed to the ball nut moves in the X-axis direction along the X-axis guide rail.

Configuration of the Rotary Head

Figure 2:
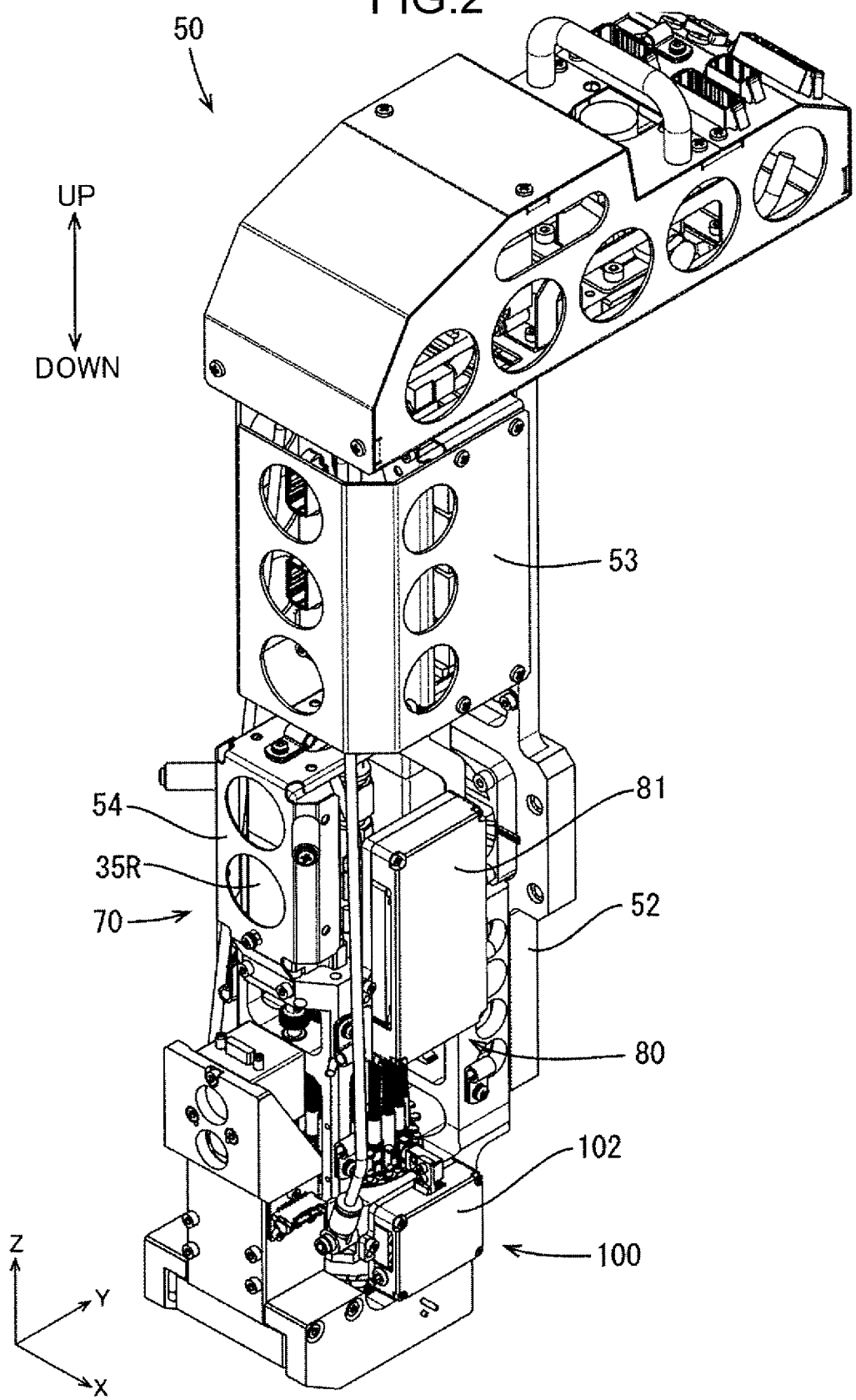
FIG. 2 is a perspective view of a rotary head included in the component mounting device.

Next, the configuration of the rotary head 50 will be described. FIG. 2 is a perspective view of the rotary head 50. The rotary head 50 has an arm shape, and includes a head main body 52 on which various mechanisms are mounted and head covers 53, 54 covering the head main body 52. The rotary head 50 is configured to draw and transfer the electronic component E supplied by the component supply device 40 to mount the component at a predetermined position on the printed circuit board B.

Figure 3:
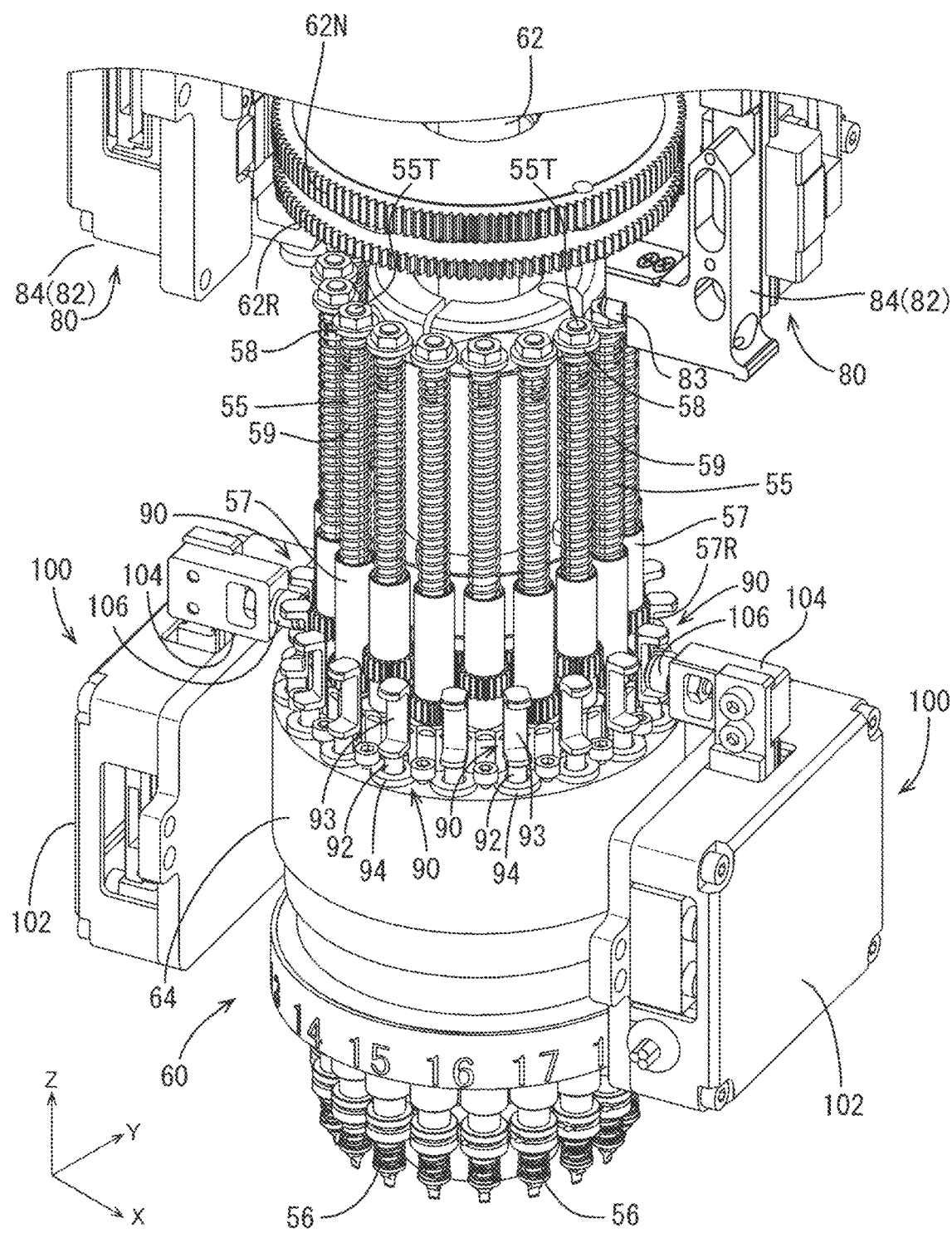
FIG. 3 is a perspective view of a main portion of the rotary head shown in FIG. 2.
Figure 4:
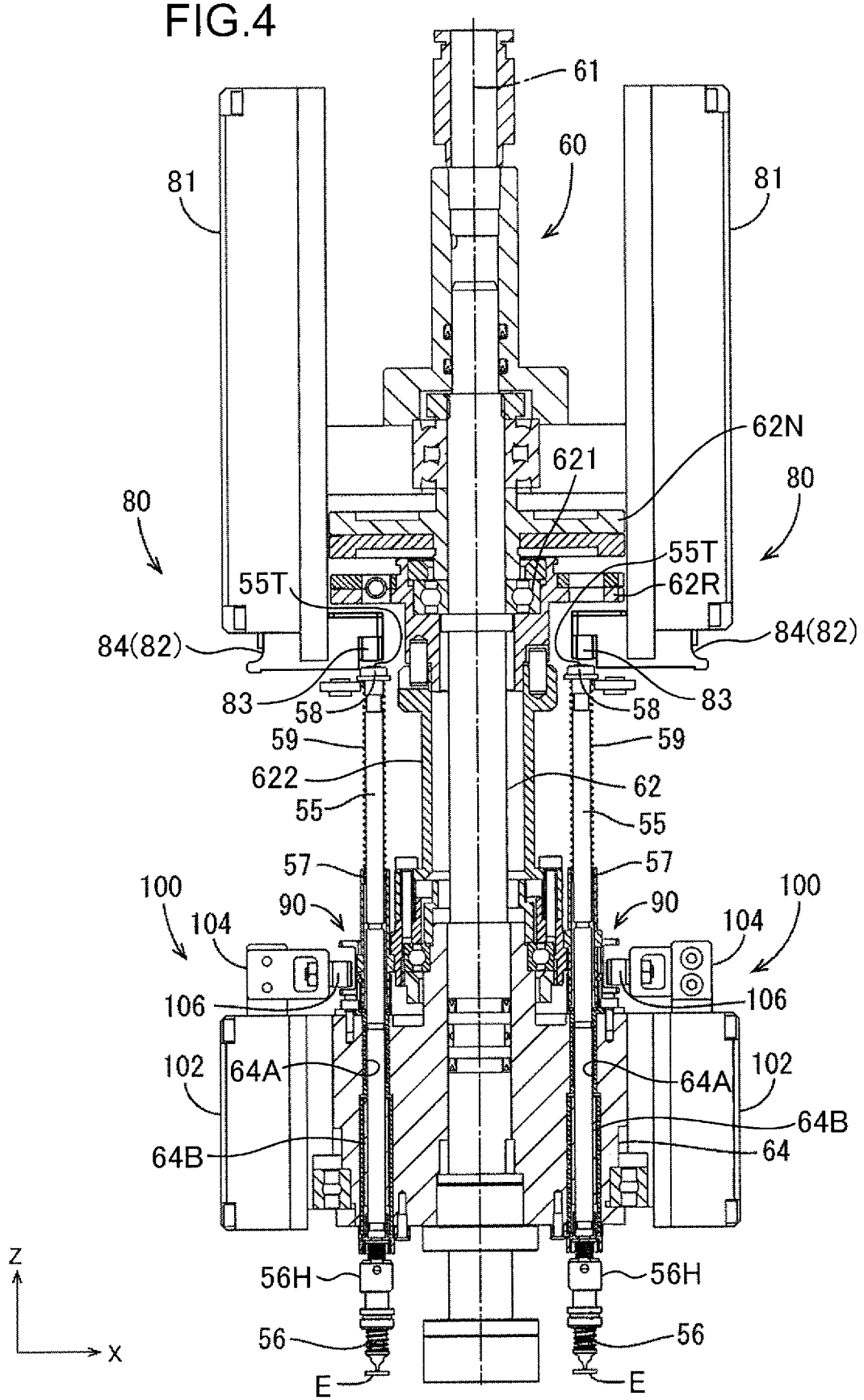
FIG. 4 is a cross-sectional view of the main portion of the rotary head.

FIG. 3 is a perspective view of a main portion of the rotary head 50. FIG. 4 is a cross-sectional view of the main portion of the rotary head 50. The rotary head 50 includes a rotating body 60 having a rotary shaft 62 and a shaft retainer 64; a plurality of nozzle shafts 55 (shafts) retained by the shaft retainer 64; an N-axis driven gear 62N; an unillustrated N-axis driver; and R-axis driven gear 62R; two Z-axis drivers 80 (raising and lowering mechanism); a plurality of switches 90 respectively allotted to the nozzle shafts 55; and two V-axis drivers 100. The embodiment represents an example where eighteen nozzle shafts 55, in total, are arranged in an annual form around a rotation axis 61 (central axis) of the rotary shaft 62 and retained by the shaft retainer 64 in a raisable and lowerable manner in the Z-axis direction.

The rotary shaft 62 of the rotating body 60 extends in the Z-axis direction. The rotary shaft 62 is supported by the head main body 52 rotatably about the rotation axis 61 of the rotary shaft 62. The shaft retainer 64 surrounds the rotary shaft 62 around a lower end of the rotary head 50, and has a substantially columnar shape with a diameter larger than a diameter of the rotary shaft 62.

The N-axis driven gear 62N is fixed to the rotary shaft 62 and rotates integrally with the rotary shaft 62. The N-axis driver is provided at the head main body 52, and has an N-axis servo motor 35N (rotation driving mechanism, see FIG. 5), and an N-axis driving gear (not shown) surrounding an output shaft of the N-axis servo motor 35N. The N-axis driving gear meshes with the N-axis driven gear 62N. Under an electricity application control of the N-axis servo motor 35N, the rotary shaft 62 is driven to rotate about the rotation axis 61 at a certain angle via rotational driving of each of the N-axis driving gear and the N-axis driven gear 62N. The shaft retainer 64 rotates along with the rotation of the rotary shaft 62.

The R-axis driven gear 62R lies below the N-axis driven gear 62N and allows the rotary shaft 62 to extend through inside. A bearing 621 (FIG. 4) is interposed between the rotary shaft 62 and the R-axis driven gear 62R. The R-axis driven gear 62R is supported by the rotary shaft 62 rotatably about the rotation axis 61 relative to the rotary shaft 62 owing to the bearing 621.

As shown in FIG. 2, an R-axis driver 70 is provided at a substantially center of the rotary head 50 in the Z-axis direction for driving a rotation of the R-axis driven gear 62R. The R-axis driver 70 has an R-axis servo motor 35R and an R-axis driving gear (not shown) surrounding an output shaft of the R-axis servo motor 35R. The R-axis driving gear meshes with the R-axis driven gear 62R. Under an electricity application control of the R-axis servo motor 35R, a nozzle-rotation rotating body 622 (FIG. 4) is rotated at a specific angle about the rotation axis 61 in the Z-axis direction via rotational driving of each of the R-axis driving gear and the R-axis driven gear 62R.

The shaft retainer 64 of the rotating body 60 has eighteen through holes 64A at regular intervals in a circumferential direction thereof. Each nozzle shaft 55 extends through the corresponding through hole 64A in the Z-axis direction to thereby penetrate the shaft retainer 64. Each through hole 64A is formed with a ball bearing 64B therein for smoothly raising and lowering the nozzle shaft 55. The nozzle shaft 55 has a nozzle retainer 56H attached to a lower end thereof protruding downward from the shaft retainer 64. The nozzle retainer 56H retains a suction nozzle 56 for suction of the electronic component E.

The suction nozzle 56 can receive a supply of a negative pressure or a positive pressure. The suction nozzle 56 sucks and keeps the electronic component E at a leading end thereof under the negative pressure and releases the electronic component E kept at the leading end under the positive pressure. The suction nozzle 56 revolves about the rotation axis 61 of the rotating body 60 together with the nozzle shaft 55 when the rotating body 60 is rotated by the N-axis driver.

Each nozzle shaft 55 is rotatable about a shaft axis thereof. The nozzle shaft 55 is inserted through a corresponding shaft holder 57 having a lower end provided with a nozzle gear 57R above the shaft retainer 64. The nozzle gear 57R meshes with a gear included in the nozzle-rotation rotating body 622 cooperating with the rotation of the R-axis driven gear 62R. The shaft holder 57 rotates about the shaft axis when the R-axis servo motor 35R drives the nozzle-rotation rotating body 622 to rotate.

The nozzle shaft 55 has an upper end 55T (pressed part) around which a spring detent bolt 58 is tightened. The return spring 59 is provided to surround an upper portion of the nozzle shaft 55 inserted therethrough. The return spring 59 is compressed between the spring detent bolt 58 and the shaft holder 57. The nozzle shaft 55 is urged upward with an elastic force of the return spring 59.

The two Z-axis drivers 80 are stationary and symmetric across the rotation axis 61 in the X-axis direction of the rotary head 50. Each of the Z-axis drivers 80 raises and lowers a selected nozzle shaft 55 that is located at the arranged position of the Z-axis driver 80 among the eighteen nozzle shafts 55 in the annual form. Specifically, one Z-axis driver 80 is located at a specific position on a circle of the annual form of the eighteen nozzle shafts 55 to shift one nozzle shaft 55 stopped at the specific position by the rotation of the rotating body 60 in the Z-axis direction.

The Z-axis driver 80 has a Z-axis driving source 81 having a box shape; a Z-axis movable part 82 extending downward from the Z-axis driving source 81; and a cam follower 83 (actuating member). The Z-axis driving source 81 has therein a Z-axis linear motor 35Z (FIG. 5) for moving the Z-axis movable part 82 by linear motor driving. The Z-axis movable part 82 is supported movably to the Z-axis driving source 81 in the Z-axis direction.

The cam follower 83 is arranged so as to be contactable with the upper end 55T (pressed part) of the aforementioned one nozzle shaft 55 stopped at the specific position. In other words, the N-axis driver drives a rotation of the rotating body 60 so that the upper end 55T of the selected one nozzle shaft 55 comes under the arranged position of the cam follower 83. The cam follower 83 is attached to a lower end of the Z-axis movable part 82 via a holder 84. The holder 84 holds the cam follower 83 rotatably about an axis extending in the X-axis direction.

When the Z-axis driving source 81 lowers the Z-axis movable part 82, the cam follower 83 comes into contact with the upper end 55T of the nozzle shaft 55 at the specific position and presses the upper end 55T to lower the nozzle shaft 55 against the urging force of the return spring 59 (first posture of the cam follower 83). When the nozzle shaft 55 is lowered, the suction nozzle 56 attached to the lower end of the nozzle shaft 55 is lowered as well. In this manner, the leading end of the suction nozzle 56 approaches the component supply position of the component supply device 40 or the predetermined position on the printed circuit board B. When the Z-axis movable part 82 is raised from this state, the cam follower 83 pressing the upper end 55T is also raised (second posture of the cam follower 83). The pressed state of the upper end 55T is thus released, and the nozzle shaft 55 and the suction nozzle 56 are raised with an elastic restoring force of the return spring 59.

In the embodiment, at least the upper end 55T of the nozzle shaft 55 and therearound and at least a surface layer portion of the cam follower 83 are made of ferromagnet. The holder 84 has therein a magnet for giving a magnetic force to the cam follower 83. This permits the cam follower 83 and the upper end 55T of the nozzle shaft 55 to attract each other with the magnetic force. The relevant feature will be described in detail later.

The switch 90 switches a pressure to be supplied to the suction nozzle 56 between the negative pressure and the positive pressure. Here, eighteen switches 90, in total, are allotted to the respective suction nozzles 56 (nozzle shafts 55). Each of the switches 90 is located between two adjacent nozzle shafts 55 and outside the nozzle shafts 55 in the annual form. As shown in FIG. 3, the switch 90 has a valve spool 92 having a shaft shape, and a sleeve 94 having a cylindrical shape for accommodating a lower portion of the valve spool 92.

The sleeve 94 is inserted in an associated attachment hole of the rotating body 60 for attachment thereto. The valve spool 92 is accommodated in the sleeve 94 so that an axial direction thereof agrees with the Z-axis direction. The valve spool 92 shifts in the sleeve 94 in the Z-axis direction to switch a pressure of air to be supplied to the suction nozzle 56 between the negative pressure and the positive pressure. In the embodiment, explanation for a route of supplying the negative pressure and the positive pressure to each sleeve 94 is omitted.

The valve spool 92 has an abutment part 93 in an upper portion thereof. The abutment part 93 has a substantially sideways U-shape, and a V-axis cam follower 106 included in the V-axis driver 100 to be described later is to abut the abutment part. The abutment part 93 has an opening having the U-shape and facing outward (oppositely to the rotary shaft 62).

The two V-axis drivers 100 are symmetric across the rotary shaft 62 of the rotating body 60 respectively on the left and right sides of the rotary head 50. Each of the V-axis drivers 100 is configured to shift the valve spool 92 of the corresponding switch 90 in the Z-axis direction. The V-axis driver 100 has a V-axis driving source 102 having a box shape, and a V-axis movable part 104 extending upward from the V-axis driving source 102. The V-axis driving source 102 has therein a V-axis linear motor 35V (FIG. 5) for moving the V-axis movable part 104 by linear motor driving. The V-axis movable part 104 is supported movably to the V-axis driving source 102 in the Z-axis direction.

The V-axis movable part 104 has an upper end to which the V-axis cam follower 106 is attached rotatably about an axis extending in the X-axis direction. The V-axis movable part 104 is supported by the V-axis driving source 102 so that the V-axis cam follower 106 is located inside the abutment part 93 having the substantially U-shape with respect to the valve spool 92 corresponding to the selected nozzle shaft 55 to be raised and lowered.

When the V-axis driving source 102 moves the V-axis movable part 104 upward, the V-axis cam follower 106 abuts the abutment part 93 and presses the valve spool 92 upward to thereby supply the negative pressure to the suction nozzle 56. Conversely, when the V-axis driving source 102 moves the V-axis movable part 104 downward, the V-axis cam follower 106 abuts the abutment part 93 at each of the opposite positions thereacross and presses the valve spool 92 downward to thereby supply the positive pressure to the suction nozzle 56.

Meanwhile, a board recognition camera C1 (see FIG. 5) is mounted on the rotary head 50. The board recognition camera C1 captures an image at a certain position on the printed circuit board B stopped at the work position by moving integrally with the rotary head 50. Besides, a component recognition camera C2 (see FIG. 1) is fixedly arranged in a vicinity of the work position on the base 10. The component recognition camera C2 captures an image of the electronic component E sucked from the component supply position of the component supply device 40 by the suction nozzle 56.

[Electric Configuration of the Surface Mounter]

Figure 5:
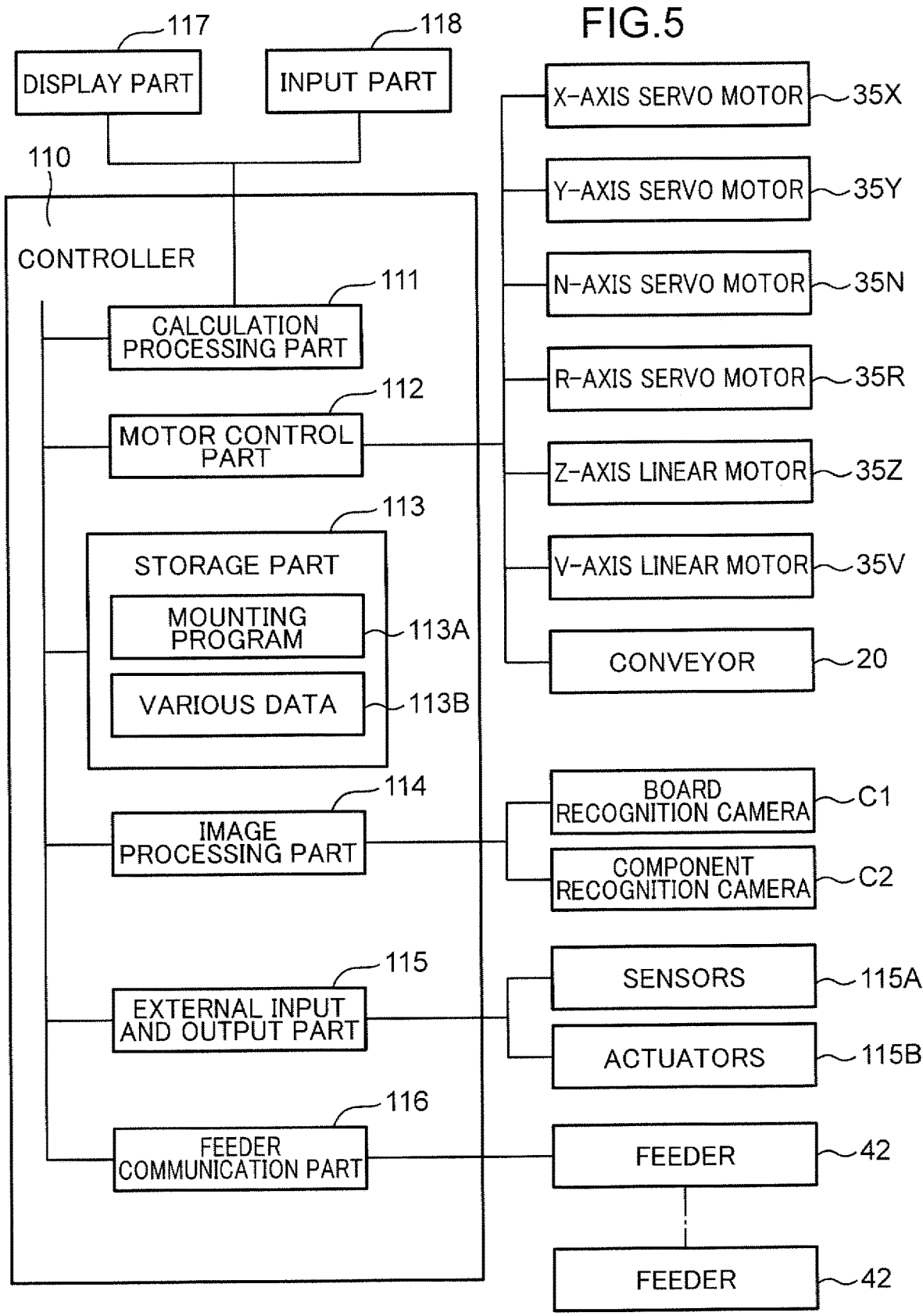
FIG. 5 is a block diagram illustrating an electric configuration of the surface mounter.

Subsequently, an electric configuration of the surface mounter 1 will be described with reference to FIG. 5. The surface mounter 1 has a main body entirely and totally controlled by a controller 110. The controller 110 includes a calculation processing part 111 configured by a CPU or the like. A motor control part 112, a storage part 113, an image processing part 114, an external input and output part 115, a feeder communication part 116, a display part 117, and an input part 118 are connected to the calculation processing part 111.

The motor control part 112 drives, based on a mounting program 113A stored in the storage part 113, the X-axis servo motor 35X and the Y-axis servo motor 35Y of the component mounting device 30. The motor control part 112 further drives the N-axis servo motor 35N, the R-axis servo motor 35R, the Z-axis linear motor 35Z, and the V-axis linear motor 35V each mounted on the rotary head 50. Besides, the motor control part 112 drives the conveyer 20 in accordance with the mounting program 113A.

The storage part 113 includes a ROM (Read Only Memory) for storing a program for controlling the CPU, and a RAM (Random Access Memory) for temporally storing various kinds of data during an operation of the device. The storage part 113 stores the mounting program 113A and various data 113B.

The various data 113B includes board information about the number of produced printed circuit boards B for the mounting; component information including the number of and the kind of electronic components E to be mounted onto each printed circuit board B; mounting position information about a mounting position for each electronic component E onto the printed circuit board B; and data about the number of and the kind of the electronic components E housed in each feeder 42 of the component supply device 40.

The image processing part 114 takes in image signals respectively output from the board recognition camera C1 and the component recognition camera C2. The image processing part 114 performs, based on the image signals taken from the board recognition camera C1 and the component recognition camera C2, image processing for component image analysis and board image analysis.

The external input and output part 115 serves as an interface, and takes in a detection signal output from each of various sensors 115A arranged at the main body of the surface mounter 1. The external input and output part 115 controls, based on a control signal output from the calculation processing part 111, an operation for each of various actuators 115B.

The feeder communication part 116 is connected to a control part included in each feeder 42 attached to the component supply device 40 to thereby totally control the feeders 42. The control part of the feeder 42 controls driving of a motor for sending out the component supply tape.

The display part 117 includes a liquid crystal display having a display screen for displaying a state of the surface mounter 1 thereon. The input part 118 is composed of a keyboard for receiving an input from the outside through a manual operation.

The surface mounter 1 having the above-described configuration permits, in an automatic operation, alternate execution of conveyance of the printed circuit board B to the work position on the base 10 by the conveyer 20 and mounting of the component onto the printed circuit board B conveyed to the work position. In the mounting, a suction work and a mounting work are alternately repeated, the suction work causing the eighteen suction nozzles 56 to respectively suck the electronic components E supplied by the component supply device 40, and the mounting work moving the rotary head 50 and mounting each electronic component E onto the printed circuit board B.

[Details of the Z-Axis Movable Part]

Figure 6:
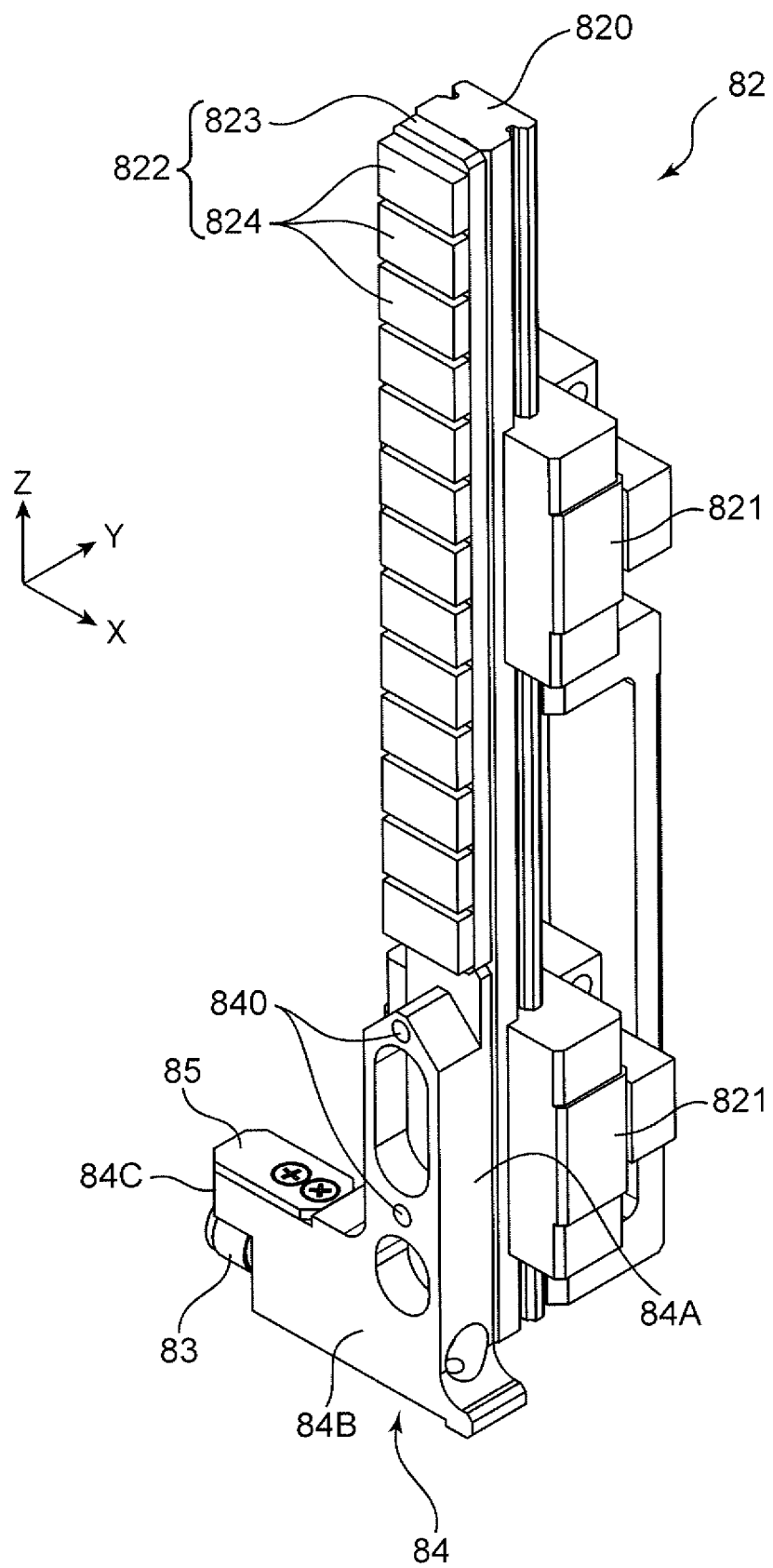
FIG. 6 is a perspective view of a Z-axis driver of the rotary head.
Figure 7:
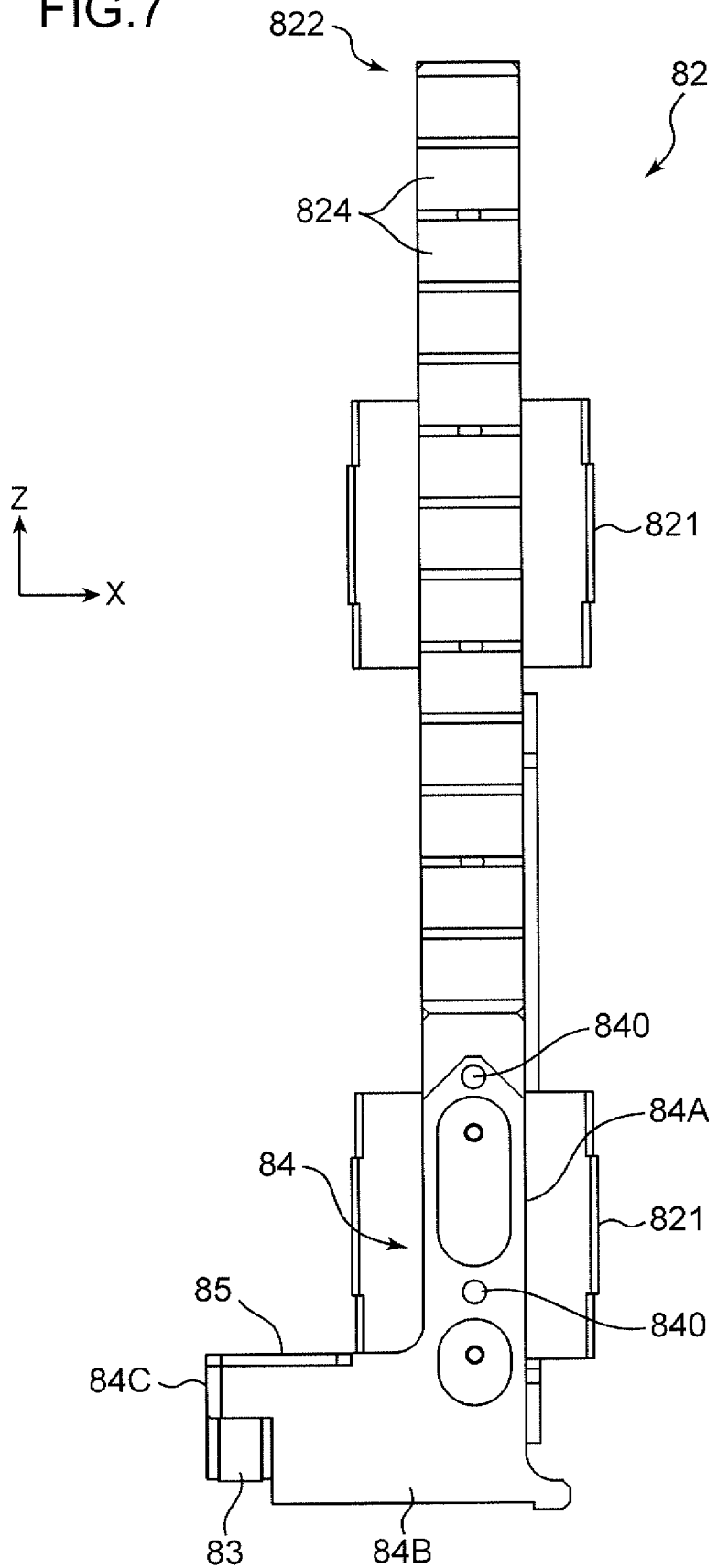
FIG. 7 is a side view of the Z-axis driver.
Figure 8:
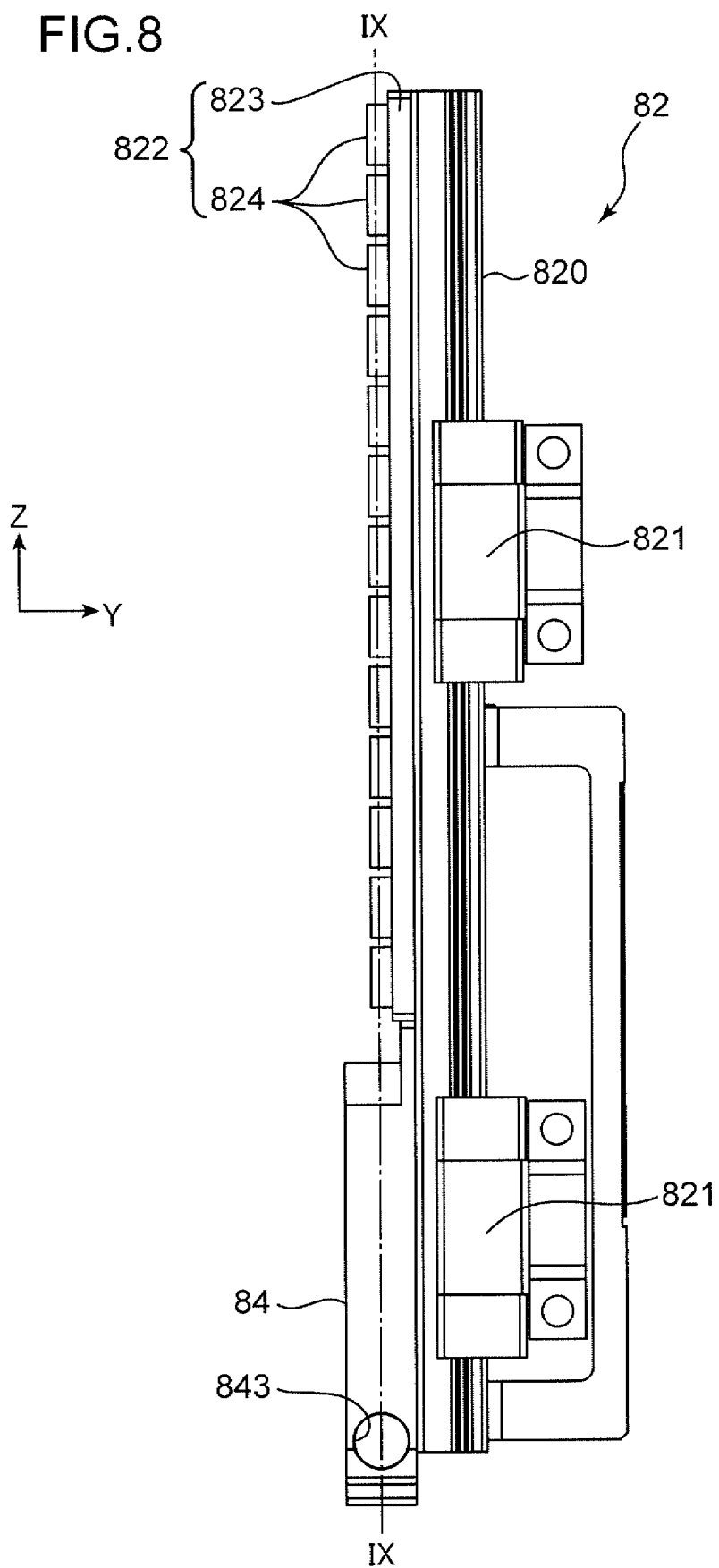
FIG. 8 is a front view of the Z-axis driver.

Next, a detailed structure of the Z-axis movable part 82 of the Z-axis driver 80 (raising and lowering mechanism) of the rotary head 50 will be described with reference to FIG. 6 to FIG. 9. FIG. 6, FIG. 7, and FIG. 8 are respectively a perspective view, a side view, and a front view of the Z-axis movable part 82. FIG. 9 is a cross-sectional view taken along the line IX-IX in FIG. 8. In addition to the cam follower 83 and the holder 84, the Z-axis movable part 82 includes a rail 820, a pair of upper and lower rail guides 821, and a mover 822 each forming a part of a linear motor mechanism including the Z-axis linear motor 35Z (FIG. 5).

The rail 820 is a longitudinal member linearly extending in the Z-axis direction, and has a flat side surface in the Y-axis thereof and another side surface formed with a rail groove in the X-axis direction, the rail groove extending in the Z-axis direction. Each of the rail guides 821 is fixed to a housing of the Z-axis driving source 81 (FIG. 2, FIG. 4), and has a guide section fitting in the rail groove of the rail 820. The rail 820 is slidable in the Z-axis while being guided by the rail guide 821.

The mover 822 forms the linear motor in cooperation with an unillustrated stator arranged in the Z-axis driving source 81. The mover 822 has a yoke 823 and a plurality of permanent magnets 824. The yoke 823 is made of pure iron or low carbonate steel, and is in the form of a thick, long, rectangular, and flat plate. The yoke 823 has a back surface attached to the flat surface of the rail 820. The permanent magnets 824 are arrayed in the Z-axis direction at predetermined equal pitches on a front surface of the yoke 823.

In the Z-axis direction, an entire dimension of the rail 820 is longer than that of the yoke 823, and the yoke 823 is attached to the rail 820 at a position closer to the top of the rail. The holder 84 is attached to a lower region of the rail 820 serving as a vacant space by a fastener 840, such as a screw fastener. Specifically, the mover 822 and the holder 84 are attached to the rail 820 in such a manner as to vertically align. When the linear motor operates to raise and lower the rail 820, the holder 84 and the cam follower 83 held by the holder 84 are also raised and lowered accordingly.

The holder 84 is made of non-magnetic metal like aluminum alloy, and has an L-shape in a side view (FIG. 7). The holder 84 has an attachment part 84A, a holder main body 84B, and a distal end protrusion 84C. The attachment part 84A is an extension in the Z-axis direction, and has substantially the same width as the rail 820 in the X-axis direction. The attachment part 84A is attached to the flat surface of the rail 820, and is fastened to the rail 820 by the fastener 840. The holder main body 84B further extends from a lower end of the attachment part 84A in the X-axis direction. The distal end protrusion 84C protrudes farther in the X-axis direction from an upper region of the holder main body 84B at a distal end thereof. The cam follower 83 is located under the distal end protrusion 84C and rotatably held in a lower region of the holder main body 84B at the distal end thereof.

An inner structure of the holder 84 will be described with reference to FIG. 9. The holder 84 holds therein a first magnet M1 and a second magnet M2 as well as the cam follower 83. The holder main body 84B and the distal end protrusion 84C of the holder 84 have therein a cam holding section 841, a first magnet holding section 842, and a second magnet holding section 843. Each of the first and second magnets M1, M2 is provided to give a magnetic force to the cam follower 83. A holder yoke 85 is arranged on the first magnet M1.

The cam holding section 841 is a cylindrical chamber located around the distal end of the holder main body 84B in the lower region thereof and extending in the X-axis direction. The cam holding section 841 holds a rotary shaft 831 of the cam follower 83 including the bearing. The first magnet holding section 842 is a cylindrical chamber extending through the distal end protrusion 84C in the Z-axis direction. The first magnet holding section 842 holds the first magnet M1. The distal end protrusion 84C and the cam follower 83 are adjacent to each other at a very short distance therebetween in the Z-axis direction. Hence, the first magnet M1 is located in a vicinity of the cam follower 83. The first magnet M1 has a magnetization of exerting the magnetic force to an arranged position of the cam follower 83.

The second magnet holding section 843 is a cylindrical chamber coaxially communicating with the cam holding section 841 rearward and extending in the X-axis direction. The second magnet holding section 843 holds the second magnet M2. The magnet holding section 843 is adjacent to the cam holding section 841 holding the cam follower 83 in the X-axis direction. Hence, the second magnet M2 is located in a vicinity of the cam follower 83 as well. The second magnet M2 also has a magnetization of exerting a magnetic force to the arranged position of the cam follower 83.

The cam follower 83 given the magnetic force from each of the first and second magnets M1, M2 arranged in the holder 84 as described above results in having a magnetic attractive force. Furthermore, for use in the embodiment, an entirety of the nozzle shaft 55 is made of ferromagnet, such as iron or iron alloy, or at least the upper end 55T (pressed part) and therearound is made of ferromagnet. With this configuration, a force of brining the cam follower 83 and the upper end 55T of the nozzle shaft 55 into close contact with each other occurs therebetween owing to the magnetic force. A force by addition of the magnetic force to the urging force of the return spring 59 results in a return force of the nozzle shaft 55. That is to say, the addition of the magnetic force succeeds in increasing the return force.

[Importance of Giving the Magnetic Force to the Cam Follower]

Subsequently, the importance of giving the magnetic force to the cam follower 83 will be described with reference to FIG. 10 and FIG. 11. FIG. 10A to FIG. 10C are schematic views each explaining a raising and lowering operation of a nozzle shaft 55 in a comparative example. It should be noted here that a cam follower 83 in each comparative example is given no magnetic force.

FIG. 10A shows a state where the nozzle shaft 55 is to be raised upward, after the nozzle shaft 55 is lowered and a suction nozzle 56 attached to a lower end of the nozzle 55 via a nozzle retainer 56H sucks and keeps an electronic component E. Downward shift of a cam follower 83 by a Z-axis driver 80 achieves the lowering of the nozzle shaft 55. Along with the downward shift, the cam follower 83 takes a posture (first posture) of coming into contact with an upper end 55T of the nozzle shaft 55 and presses the upper end 55T downward against an urging force of a return spring 59.

Furthermore, upward shift of the cam follower 83 by the Z-axis driver 80 achieves the raising of the nozzle shaft 55 shown in FIG. 10A. Specifically, the cam follower 83 takes another posture (second posture) of releasing the pressing onto the upper end 55T by the cam follower 83. Upon release of the pressing of the cam follower 83, the nozzle shaft 55 is raised with the urging force of the return spring 59. In FIG. 10A, a raising acceleration of the cam follower 83 raised by the Z-axis driver 80 is denoted by an arrow A, and the urging force of the return spring 59 is denoted by an arrow F1.

In contrast, two forces against the urging force F1 of the return spring 59 occur in the raising of the nozzle shaft 55 after the suction nozzle 56 keeps the component E. One of the two forces is a frictional force F2 occurring between a through hole 64A of a shaft retainer 64 of a rotating body 60 that retains the nozzle shaft 55 and an outer circumference of the nozzle shaft 55. An occurrence of the frictional force F2 in a certain amount is unavoidable even in a configuration having a ball bearing 64B in the through hole 64A.

The other of the two forces is an inertial force F3 acting on the nozzle shaft 55. The inertial force F3 is proportional to a total weight of the weight of the nozzle shaft 55, the weight of each of the nozzle retainer 56H and the suction nozzle 56, and the weight of the electronic component E sucked by the suction nozzle 56. Meanwhile, in an attempt to mount a large electronic component E, a weight of the electronic component E itself is heavier, and a larger nozzle retainer 56H and a larger suction nozzle 56 are required and thus the retainer and the nozzle are also heavier. Accordingly, the inertial force F3 tends to increase as the electronic component E to be mounted is larger.

The sum of the frictional force F2 and the inertial force F3 is occasionally greater than the urging force F1 of the return spring 59. In this occasion, the nozzle shaft 55 may fail to follow the raising of the cam follower 83 as shown in FIG. 10B. As denoted by an arrow a1 in the drawing, the cam follower 83 is raised at a predetermined speed by the linear motor mechanism of the Z-axis driver 80. In contrast, the nozzle shaft 55 is raised with the urging force F1 of the return spring 59 as denoted by an arrow a2. However, the urging force F1 is attenuated by the frictional force F2 and the inertial force F3, and therefore, the raising of nozzle shaft 55 delays from the raising of the cam follower 83. As a result, a bottom surface of the cam follower 83 and the upper end 55T of the nozzle shaft 55 are temporally separated from each other, and a gap G comes into existence therebetween.

Thereafter, as shown in FIG. 10C, the upper end 55T comes into re-contact with the cam follower 83. In other words, the nozzle shaft 55 is raised to compensate for the delaying as denoted by an arrow a3, and thus the upper end 55T thereof hits the cam follower 83. In the re-contact, the nozzle shaft 55 receives an impact. This would cause defects of falling-off of the electronic component E being kept, deviation of the sucking posture of the nozzle shaft 55, or other defects. In particular, falling-off or posture deviation of the electronic component E caused by the impact at the re-contact after the sucked posture of the electronic component E by the suction nozzle 56 is determined to be "good" using the component recognition camera C2 would result in mounting failure or inappropriate mounting of the electronic component E.

One way of suppressing the separation of the upper end 55T and the cam follower from each other is to increase the return force of the nozzle shaft 55 by increasing the urging force F1 of the return spring 59. However, a design change accompanied by an increase in the dimension of the return spring 59, e.g., an increase in the wire diameter of the spring 59, an increase in the set length of the spring, and the like, or other change is required to increase the return force. In this respect, the rotary head 50 and the surface mounter 1 each demanding a size reduction faces a limit to an increase in the return force.

Moreover, failure of increasing the return force of the nozzle shaft 55 may cause various defects. As described above, the inertial force F3 increases as the electronic component E to be mounted is larger. Hence, the failure of increasing the return force necessitates restrictions on types or kinds of available electronic component E. This leads to a reduction in a capability range of the surface mounter 1. Furthermore, the inertial force F3 acting on the nozzle shaft 55 is proportional to a driving acceleration rate of the nozzle shaft 55 as well. Therefore, a smaller return force renders only a lower driving acceleration rate, resulting in impeding acceleration of the rotary head 50.

The frictional force F2 is reducible by countermeasures of material selection and surface coating for the nozzle shaft 55 and the rotating body 60, or improvement on performance of the ball bearing 64B. However, a drastic cost increase is unavoidable for these countermeasures. From this perspective, there is a limit to reduction of the frictional force F2 within a realistic cost range.

The rotary head 50 according to the embodiment can solve these problems. FIG. 11A to FIG. 11C are schematic views each explaining a raising and lowering operation of the nozzle shaft 55 in the present embodiment. FIG. 11A corresponds to FIG. 10A in the comparative example, and shows a state where the nozzle shaft 55 is to be raised after the suction nozzle 56 attached to the nozzle shaft 55 sucks and keeps the electronic component E. The difference from the comparative example is that a magnet M gives a magnetic force y to the cam follower 83.

A force of bringing the cam follower 83 and the upper end 55T of the nozzle shaft 55 into close contact with each other occurs therebetween owing to the magnetic force cp. In other words, the cam follower 83 results in having a force of pulling the nozzle shaft 55 upward. Specifically, the force by addition of the magnetic force y to the urging force F1 of the return spring 59 results in a return force of the nozzle shaft 55. In this respect, even when the sum of the frictional force F2 and the inertial force F3 is occasionally greater than the urging force F1 of the return spring 59, the addition of the magnetic force y can solve the greater force state. This consequently can ensure the close-contact between the cam follower 83 and the upper end 55T as shown in FIG. 11B, and prevent the gap G seen in the comparative example in FIG. 10B from coming into existence.

As shown in FIG. 11C, the close-contact between the cam follower 83 and the upper end 55T is ensured in the raising of the nozzle shaft 55, and hence, the nozzle shaft 55 never receives an impact accompanied by the re-contact as seen in the comparative example in FIG. 10C. That is to say, according to the embodiment, separation of the cam follower 83 and the upper end 55R from each other in the raising of the nozzle shaft 55 is suppressible with the assistance of the magnetic force y from the magnet M without increasing the urging force F1 of the return spring 59. This configuration can accordingly prevent the electronic component E sucked by the suction nozzle 56 from falling off or deviating from the sucked posture.

The nozzle shaft 55 is raisable and lowerable at a higher acceleration rate with the assistance of the magnetic force φ. Specifically, the acceleration of the rotary head 50 is aimed. Additionally, the capability range of the surface mounter 1 is expandable in terms of the availability of an electronic component E having a heavier weight for the mounting.

Moreover, a spring having a relatively smaller urging force F1 is adoptable as the return spring 59 in consideration of the assistance of the magnetic force φ. For instance, it is presumed that the nozzle shaft 55 needs a return force of 2 [N] (newtons) in view of the frictional force F2 and the inertial force F3. A notably large return spring 59 is required if all the force of 2 [N] is to be covered solely with the urging force F1 of the return spring 59. However, when the magnetic force φ of the magnet M can undertake around 0.5 to 1.0 [N], a smaller return spring 59 is adoptable. For example, the return spring 59 may be designed to be shorter, and a shorter nozzle shaft 55 is also adoptable. As a result, a size reduction in the rotary head 50 is attainable, and the acceleration is also easily aimed.

Success in the smaller urging force F1 of the return spring 59 further brings about secondary advantageous effects. An output from the Z-axis driver 80 for driving the cam follower 83 to press the nozzle shaft 55 provided with the return spring 59 downward is reducible to meet the smaller urging force F1. In other words, a torque generated from the Z-axis linear motor 35Z is decreasable. Accordingly, reduction in heat generation accompanied by electricity application, and improvement of accuracy through suppression of a temperature change are expectable. Besides, a spring force acting on peripheral components related to the return spring 59 is reduced owing to the smaller urging force F1. Consequently, abrasion is reducible at each part and portion, and the product life is extendable.

[Various Ways of Arranging a Magnet]

Next, various ways of arranging each magnet M in the holder 84 will be described. FIG. 12A is a cross-sectional side view of the holder 84. FIG. 12B is a front view of the holder 84. The holder 84 here corresponds to a schematic illustration of the holder 84 in the preceding FIG. 9.

The holder 84 holds the first magnet M1 and the second magnet M2 arranged at different positions from each other to give a magnetic force to the cam follower 83. The first magnet M1 has a flat first facing surface MA1 facing the cam follower 83 in the Z-axis direction. The second magnet M2 has a flat second facing surface MA2 facing the cam follower 83 in the X-axis direction. The holder 84 holds the first and second magnets M1, M2 so that a facing direction of the first facing surface M1A and a facing direction of the second facing surface M2A intersect with each other. FIG. 12A shows an example where the facing direction of the first facing surface M1A and the facing direction of the second facing surface M2A perpendicularly intersect with each other. Specifically, a normal line n1 of the first facing surface M1A and a normal line n2 of the second facing surface M2A perpendicularly intersect (intersect) with each other.

The first facing surface M1A of the first magnet M1 and the second facing surface M2A of the second magnet M2 have a magnetization of the same magnetic pole. Specifically, the south pole or S-pole of the first magnet M1 is set to the first facing surface M1A, and the S-pole of the second magnet M2 is set to the second facing surface M2A. The configuration where the first and second facing surfaces M1A, M2A each facing the cam follower 83 have the magnetization of the same magnetic pole permits each of the first and second magnets M1, M2 to efficiently exert the magnetic force to the cam follower 83.

The cam follower 83 is located at an intersection where the normal line n1 of the first facing surface M1A and the normal line n2 of the second facing surface M2A perpendicularly intersect with each other. This means that the cam follower 83 is located at the position where the magnetic forces exerted from the first and second magnets M1, M2 mostly focus. Specifically, the two magnets M1, M2 arranged in the directions perpendicularly intersecting with each other give the magnetic forces to the cam follower 83 in a multifaceted manner, and accordingly, the cam follower 83 can have a strong magnetization.

Furthermore, a first holder yoke 851 is arranged at the north pole or N-pole of the first magnet M1, and a second holder yoke 852 is arranged at the N-pole of the second magnet M2. Each of the first and second holder yokes 851, 852 serves to cause the magnetic force exerted from the corresponding magnet to focus onto the cam follower 83. The arrangement of the first and second holder yokes 851, 852 allows the magnetic force exerted from each of the first and second magnets M1, M2 to have directivity. Accordingly, each of the first and second magnets M1, M2 can more efficiently exert the magnetic force to the cam follower 83.

The cam follower 83 is preferably made of ferromagnet to easily have a magnetization with the magnetic force from each of the first and second magnets M1, M2. Alternatively, at least a surface layer portion 83A of the cam follower 83 is preferably made of ferromagnet. In this manner, the cam follower 83 is configured to be easily given a large magnetic force, resulting in enhancing the close-contact between the upper end 55T of the nozzle shaft 55 and the cam follower 83.

As another way of giving the magnetic force to the cam follower 83, the cam follower 83 itself may be made of magnet. In this case, the cam follower 83 preferably has a back surface provided with a yoke to cause the magnetic force to focus onto the upper end 55T of the nozzle shaft 55. However, the cam follower 83 also serves to press the nozzle shaft 55, and thus needs an appropriate mechanical strength for the pressing. The cam follower 83 made of magnet faces difficulty in ensuring the mechanical strength. From this perspective, the cam follower 83 is preferably made of ferromagnet, such as iron or iron alloy, having an excellent mechanical strength.

Figure 13A:
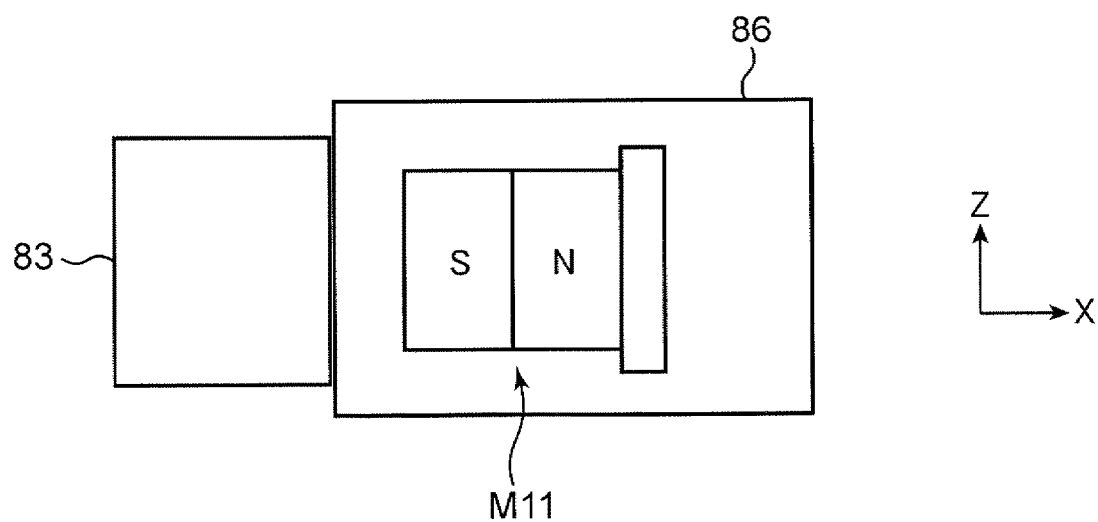
FIG. 13A and FIG. 13B are cross-sectional side views respectively representing a first modification and a second modification of the holder.

Although FIG. 12 shows the example of the two magnets M1, M2 arranged in the holder 84, one magnet, or three or more magnets may be arranged in the holder 84. FIG. 13A is a cross-sectional side view of a holder 86 according to a first modification. The first modification represents an example where only a single magnet M11 is arranged in the holder 86. The arranged position of the magnet M11 is equivalent to that of the second magnet M2 shown in the preceding FIG. 12. Specifically, the magnet M11 is disposed in the holder 86 so that the S-pole of the magnet faces the cam follower 83 in the X-axis direction. The cam follower 83 is given a magnetic force from the magnet M11.

Figure 13B:
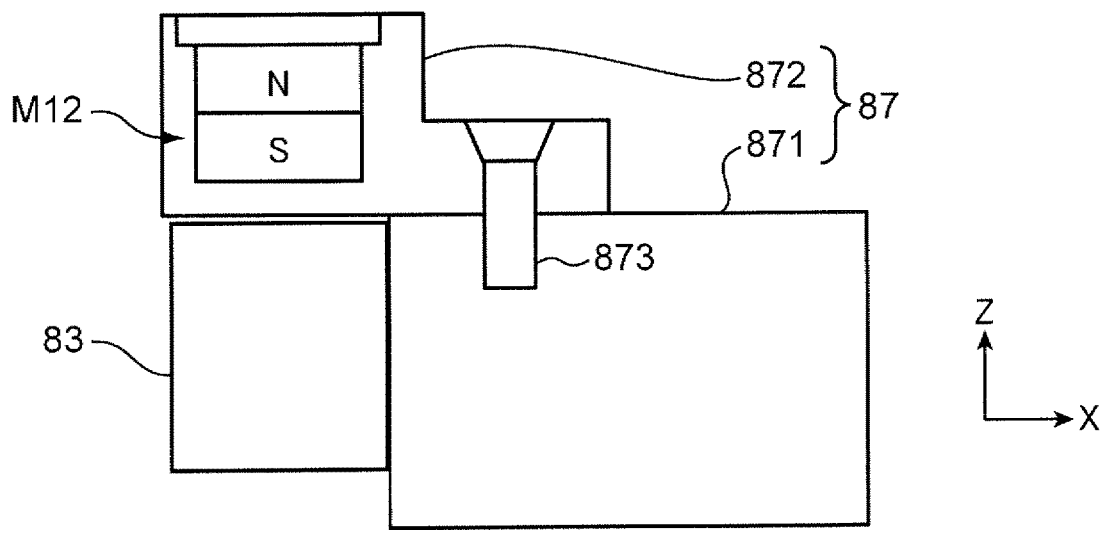

FIG. 13B is a cross-sectional side view of a holder 87 according to a second modification. The second modification also shows an example where only a single magnet M12 is arranged in the holder 87. The arranged position of the magnet M12 is equivalent to that of the first magnet M1 shown in the preceding FIG. 12. The holder 87 has a first section 871 adjacent to (a right side of) the cam follower 83 in the X-axis direction and a second section 872 adjacent to (an upper side of) the cam follower 83 in the Z-axis direction, the first section and the second section being coupled to each other by a fixing screw 873. The magnet M12 is disposed in the second section 872 so that the S-pole of the magnet faces the cam follower 83 in the Z-axis direction. The second modification has advantage that the magnet M12 is retrofittable to an already existing holder 84.

Figure 14A:
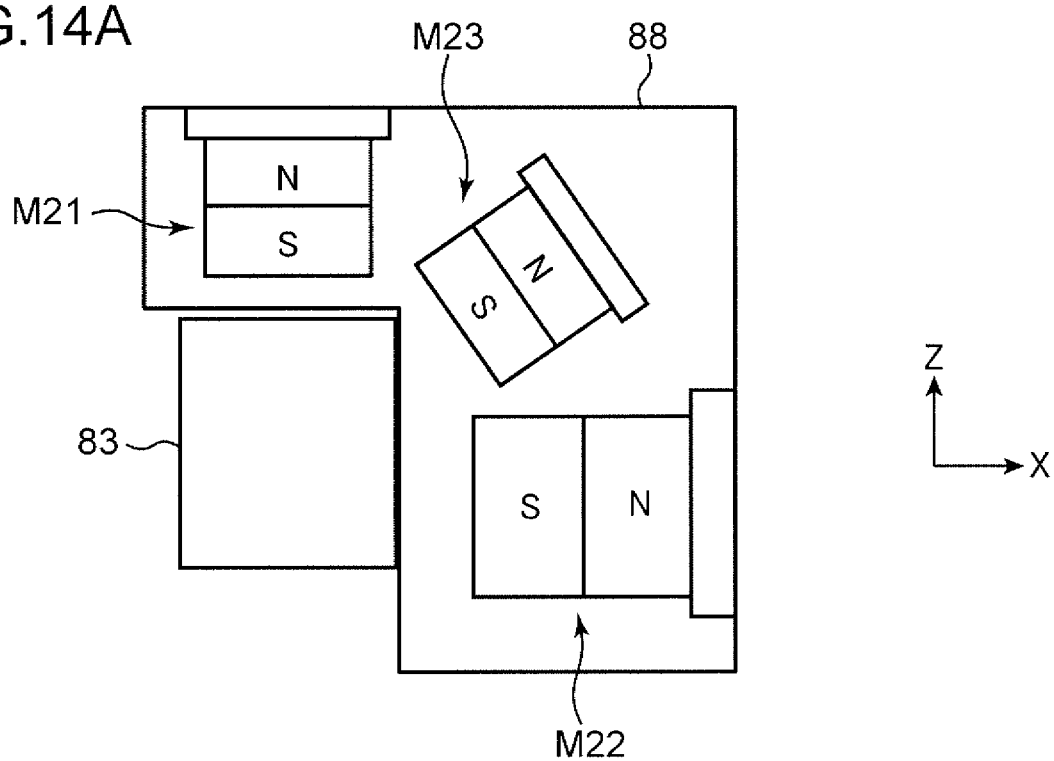
FIG. 14A is a cross-sectional side view representing a third modification of the holder.

FIG. 14A is a cross-sectional side view showing an X-Z plane of a holder 88 according to a third modification. The third modification represents an example where three magnets, namely, first, second, and third magnets M21, M22, and M23 are arranged in the holder 88. The first magnet M21 faces the cam follower 83 in the Z-axis direction, and the second magnet M 22 faces the cam follower 83 in the X-axis direction. The third magnet M23 faces the cam follower 83 on a diagonal in the middle between the X-axis and the Z-axis. The first, second, and third magnets M21, M22, M23 are disposed in the holder 88 so that the S-pole of each magnet faces the cam follower 83.

Figure 14B:
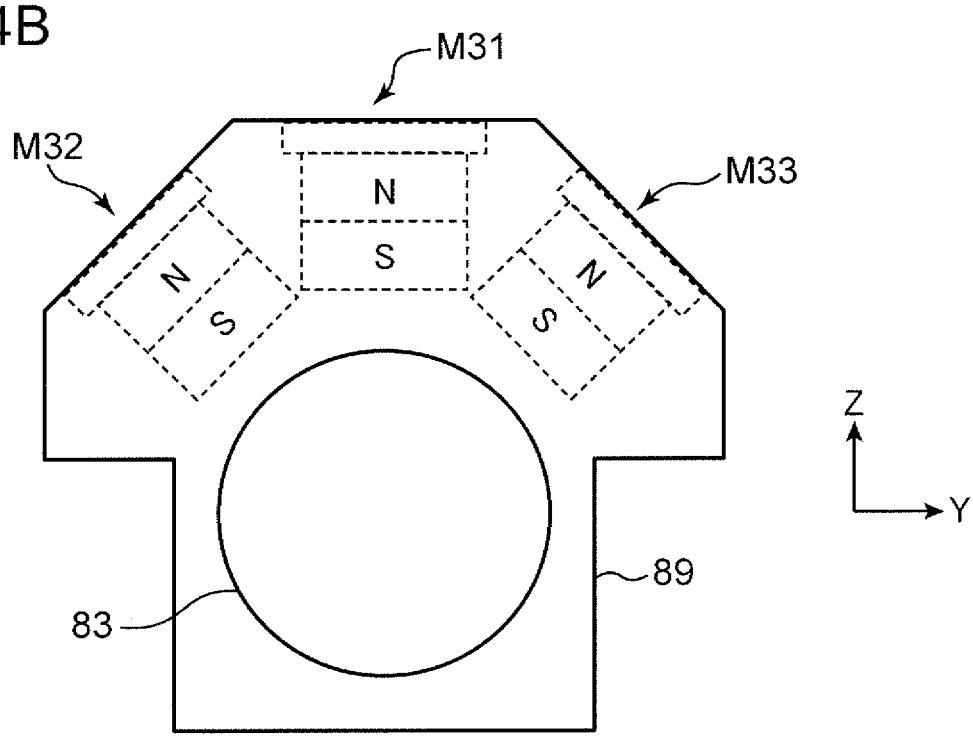
FIG. 14B is a front view representing the fourth modification of the holder.

FIG. 14B is a cross-sectional side view showing a Y-Z plane of a holder 89 according to a fourth modification. The fourth modification also shows an example where three magnets, namely, first, second and third magnets M31, M32, M33 are arranged in the holder 89. The fourth modification further shows that the three magnets are arranged in a circumferential direction of the cam follower 83 in the example. Specifically, the first magnet M31 faces the cam follower 83 in the Z-axis direction. In contrast, each of the second magnet M32 and the third magnet M33 diagonally faces the cam follower 83 at a shift from the first magnet M31 in the circumferential direction. The first, second, and third magnets M31, M32, M33 are disposed in the holder 89 so that the S-pole of each magnet faces the cam follower 83. According to the third and fourth modifications, the cam follower 83 has a stronger magnetization owing to the magnetic forces given from the three magnets.

According to the present disclosure described heretofore, at least the upper end 55T (pressed part) of the nozzle shaft 55 is made of ferromagnet, and the cam follower 83 (actuating member) is given the magnetic force y from the magnet M. Therefore, a force of bringing the upper end and the cam follower into close contact with each other occurs therebetween owing to the magnetic force φ. Specifically, the force by addition of the magnetic force y to the urging force F1 of the return spring 59 results in a return force of the nozzle shaft 55. This configuration can suppress separation of the upper end 55T and the cam follower 83 from each other in the raising of the nozzle shaft 55 without increasing the urging force F1 of the return spring 59. Therefore, such an event that the upper end 55T comes into re-contact with the cam follower 83 after the separation thereof from each other inherently never happens, and thus an impact accompanied by the re-contact onto the nozzle shaft 55 is avoidable in advance. This consequently prevents defects of, for example, falling-off of the electronic component E kept by the suction nozzle 56 and deviation of the sucked posture of the electronic component E, or other defects.

The embodiment described heretofore mainly covers an disclosure including the configuration to be described blow.

A shaft drive device according to an aspect of the present disclosure includes a plurality of shafts each having a pressed part and retained in a raisable and lowerable manner; a return spring provided for each of the shafts to urge the shaft upward; an actuating member contactable with the pressed part of any one of the shafts for raising and lowering a selected shaft; and a raising and lowering mechanism which changes a posture of the actuating member between a first posture of coming into contact with the pressed part of the shaft and pressing the pressed part to lower the shaft against an urging force of the return spring and a second posture of releasing the pressing. The pressed part of the shaft is made of ferromagnet, and the actuating member is given a magnetic force.

According to the shaft drive device, the pressed part of the shaft is made of ferromagnet, and the actuating member is given the magnetic force. Therefore, a force of bringing the pressed part and the actuating member into close contact with each other occurs therebetween owing to the magnetic force. Specifically, a force by addition of the magnetic force to the urging force of the return spring results in a return force of the shaft. This configuration can suppress separation of the pressed part and the actuating member from each other in the raising of the shaft without increasing the urging force of the return spring. Consequently, an impact accompanied by re-contact after the separation onto the shaft is avoidable.

The shaft drive device preferably further includes a magnet located in a vicinity of the actuating member. The magnet preferably has a magnetization of exerting the magnetic force to an arranged position of the actuating member.

The shaft drive device succeeds in easily giving the magnetic force to the actuating member. Furthermore, the actuating member can be made of material having an excellent strength in place of magnet. Accordingly, the actuating member can have increased durability.

In the shaft drive device, it is preferable that the magnet include a first magnet and a second magnet arranged at different positions from each other, the first magnet have a first facing surface facing the actuating member, and that the second magnet have a second facing surface facing the actuating member, the first facing surface and the second facing surface having a magnetization of the same magnetic pole.

According to the shaft drive device, the first and second magnets arranged in the multifaceted manner can efficiently give their respective magnetic forces to the actuating member.

The shaft drive device preferably further includes a holder which holds the first magnet and the second magnet so that a facing direction of the first facing surface and a facing direction of the second facing surface intersect with each other. The actuating member is preferably located at an intersection of a normal line of the first facing surface and a normal line of the second facing surface.

According to the shaft drive device, the actuating member is located at a position where the magnetic forces of the first and second magnets mostly focus. This arrangement further enhances the close-contact between the pressed part and the actuating member.

The shaft drive device preferably further includes a yoke for causing the magnetic force generated by the magnet to focus onto the actuating member.

According to the shaft drive device, the yoke allows the magnetic force to have directivity. Therefore, the magnetic force of the magnet can be efficiently exerted to the actuating member.

In the shaft drive device, at least a surface layer portion of the actuating member is preferably made of ferromagnet.

According to the shaft drive device, the actuating member is configured to be easily given a large magnetic force, resulting in enhancing the close-contact between the pressed part and the actuating member.

The shaft drive device may further include a rotating body which holds the shafts in an annual form around a central axis, and rotates about the central axis; and a rotation driving mechanism which drives a rotation of the rotating body. The rotation driving mechanism is configurable to rotate the rotating body so that the pressed part of the selected shaft comes under the arranged position of the actuating member.

The shaft drive device can select any one of the shafts by rotating the rotating body, and permits the actuating member to raise and lower the selected shaft. In the raising and lowering, the close-contact between the actuating member and the pressed part of the shaft can be ensured with the assistance of the magnetic force.

A component mounting device according to another aspect of the present disclosure includes a rotary head for mounting a component onto a board. The rotary head includes a plurality of shafts each having a pressed part at an upper end thereof and a component suction nozzle at a lower end thereof; a rotating body which holds the shafts in an annual form around a central axis in a raisable and lowerable manner, and rotates about the central axis; a return spring provided for each of the shafts to urge the shaft upward; an actuating member contactable with the pressed part of any one of the shafts for raising and lowering a selected shaft; a raising and lowering mechanism which changes a posture of the actuating member between a first posture of coming into contact with the pressed part of the shaft and pressing the pressed part to lower the shaft against an urging force of the return spring and a second posture of releasing the pressing; and a rotation driving mechanism which drives a rotation of the rotating body so that the pressed part of the selected shaft comes under the arranged position of the actuating member. The pressed part of the shaft is made of ferromagnet, and the actuating member is given a magnetic force.

According to the component mounting device, the pressed part of the shaft of the rotary head is made of ferromagnet, and the actuating member is given the magnetic force. Therefore, a force of bringing the pressed part and the actuating member into close contact with each other occurs therebetween owing to the magnetic force. Specifically, a force by addition of the magnetic force to the urging force of the return spring results in a return force of the shaft. This configuration can suppress separation of the pressed part and the actuating member from each other in the raising of the shaft without increasing the urging force of the return spring in the rotary head. Consequently, an impact accompanied by re-contact after the separation onto the shaft is avoidable. Further, the component being kept by the suction nozzle can be prevented from falling off or deviating from the sucked posture thereof.

Conclusively, the present disclosure described heretofore can provide a shaft drive device which succeeds in suppressing separation of a pressed part of a shaft and an actuating member from each other without increasing an urging force of a return spring, and a component mounting device including a rotary head adopting the shaft drive device.

The invention claimed is:

1. A shaft drive device comprising:
    a plurality of shafts each having a pressed part and retained in a raisable and lowerable manner, the pressed part having a ferromagnet;
    a return spring provided for each of the shafts to urge a respective shaft upward;
    an actuating member, given a magnetic force, and contactable with the pressed part of a selected shaft of the shafts for raising and lowering the selected shaft; and
    a raising and lowering mechanism configured to change a posture of the actuating member between a first posture of coming into contact with the pressed part of the selected shaft and pressing the pressed part to lower the selected shaft against an urging force of the return spring and a second posture of releasing the pressed part.

2. The shaft drive device according to claim 1, further comprising:
    a magnet located in a vicinity of the actuating member, wherein
    the magnet has a magnetization of exerting the magnetic force to an arranged position of the actuating member.

3. The shaft drive device according to claim 2, wherein
    the magnet includes a first magnet and a second magnet arranged at different positions from each other,
    the first magnet has a first facing surface facing the actuating member, and
    the second magnet has a second facing surface facing the actuating member,
    the first facing surface and the second facing surface having a magnetization of a specific magnetic pole.

4. The shaft drive device according to claim 3, further comprising:
    a holder configured to hold the first magnet and the second magnet so that a facing direction of the first facing surface and a facing direction of the second facing surface intersect with each other, wherein
    the actuating member is located at an intersection of a normal line of the first facing surface and a normal line of the second facing surface.

5. The shaft drive device according to claim 2, further comprising:
    a yoke configured to cause the magnetic force generated by the magnet to focus onto the actuating member.

6. The shaft drive device according to claim 1, wherein
    at least a surface layer portion of the actuating member is made of ferromagnet.

7. The shaft drive device according to claim 1, further comprising:
    a rotating body configured to retain the shafts in an annual form around a central axis of the rotating body, and rotate about the central axis; and
    a rotation driving mechanism configured to drive a rotation of the rotating body, wherein
    the rotation driving mechanism is configured to rotate the rotating body so that the pressed part of the selected shaft comes under an arranged position of the actuating member.

8. A component mounting device including a rotary head for mounting a component onto a board, wherein
    the rotary head includes:
        a plurality of shafts each having a pressed part at an upper end thereof and a component suction nozzle at a lower end thereof, the pressed part having a ferromagnet;
        a rotating body which retains the shafts in an annual form around a central axis of the rotating body in a raisable and lowerable manner, and rotates about the central axis;
        a return spring provided for each of the shafts to urge a respective shaft upward;
        an actuating member, given a magnetic force, and contactable with the pressed part of a selected shaft of the shafts for raising and lowering the selected shaft;

a raising and lowering mechanism configured to change a posture of the actuating member between a first posture of coming into contact with the pressed part of the selected shaft and pressing the pressed part to lower the selected shaft against an urging force of the return spring and a second posture of releasing the pressed part; and a rotation driving mechanism configured to drive a rotation of the rotating body so that the pressed part of the selected shaft comes under an arranged position of the actuating member.

9. The shaft drive device according to claim 3, further comprising:
a yoke configured to cause the magnetic force generated by the magnet to focus onto the actuating member.

10. The shaft drive device according to claim 4, further comprising:
a yoke configured to cause the magnetic force generated by the magnet to focus onto the actuating member.

11. The shaft drive device according to claim 2, wherein at least a surface layer portion of the actuating member is made of ferromagnet.

12. The shaft drive device according to claim 3, wherein at least a surface layer portion of the actuating member is made of ferromagnet.

13. The shaft drive device according to claim 4, wherein at least a surface layer portion of the actuating member is made of ferromagnet.

14. The shaft drive device according to claim 5, wherein at least a surface layer portion of the actuating member is made of ferromagnet.

15. The shaft drive device according to claim 9, wherein at least a surface layer portion of the actuating member is made of ferromagnet.

16. The shaft drive device according to claim 2, further comprising:
a rotating body configured to retain the shafts in an annual form around a central axis of the rotating body, and rotate about the central axis; and
a rotation driving mechanism configured to drive a rotation of the rotating body, wherein
the rotation driving mechanism is configured to rotate the rotating body so that the pressed part of the selected shaft comes under the arranged position of the actuating member.

17. The shaft drive device according to claim 3, further comprising:
a rotating body configured to retain the shafts in an annual form around a central axis of the rotating body, and rotate about the central axis; and
a rotation driving mechanism configured to drive a rotation of the rotating body, wherein
the rotation driving mechanism is configured to rotate the rotating body so that the pressed part of the selected shaft comes under the arranged position of the actuating member.

18. The shaft drive device according to claim 4, further comprising:
a rotating body configured to retain the shafts in an annual form around a central axis of the rotating body, and rotate about the central axis; and
a rotation driving mechanism configured to drive a rotation of the rotating body, wherein
the rotation driving mechanism is configured to rotate the rotating body so that the pressed part of the selected shaft comes under the arranged position of the actuating member.

19. The shaft drive device according to claim 5, further comprising:
a rotating body configured to retain the shafts in an annual form around a central axis of the rotating body, and rotate about the central axis; and
a rotation driving mechanism configured to drive a rotation of the rotating body, wherein
the rotation driving mechanism is configured to rotate the rotating body so that the pressed part of the selected shaft comes under the arranged position of the actuating member.

20. The shaft drive device according to claim 6, further comprising:
a rotating body configured to retain the shafts in an annual form around a central axis of the rotating body, and rotate about the central axis; and
a rotation driving mechanism configured to drive a rotation of the rotating body, wherein
the rotation driving mechanism is configured to rotate the rotating body so that the pressed part of the selected shaft comes under an arranged position of the actuating member.

* * * * *